United States Patent
Li et al.

(10) Patent No.: US 12,133,411 B2
(45) Date of Patent: Oct. 29, 2024

(54) DISPLAY PANEL AND DISPLAY APPARATUS

(71) Applicant: BOE TECHNOLOGY GROUP CO., LTD., Beijing (CN)

(72) Inventors: Wei Li, Beijing (CN); Shi Shu, Beijing (CN); Wei Huang, Beijing (CN); Dini Xie, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 447 days.

(21) Appl. No.: 17/606,506

(22) PCT Filed: Nov. 6, 2020

(86) PCT No.: PCT/CN2020/127269
§ 371 (c)(1),
(2) Date: Oct. 26, 2021

(87) PCT Pub. No.: WO2022/094973
PCT Pub. Date: May 12, 2022

(65) Prior Publication Data
US 2022/0352487 A1 Nov. 3, 2022

(51) Int. Cl.
*H10K 50/844* (2023.01)
*H10K 50/818* (2023.01)
(Continued)

(52) U.S. Cl.
CPC ......... *H10K 50/844* (2023.02); *H10K 50/818* (2023.02); *H10K 50/858* (2023.02);
(Continued)

(58) Field of Classification Search
CPC .. H10K 50/844; H10K 50/858; H10K 50/818; H10K 59/122; H10K 59/873; H10K 59/38
See application file for complete search history.

(56) References Cited

U.S. PATENT DOCUMENTS

2007/0194696 A1   8/2007   Hsu et al.
2017/0062540 A1   3/2017   Kim et al.
(Continued)

FOREIGN PATENT DOCUMENTS

| CN | 109638055 | 4/2019 |
|---|---|---|
| CN | 111063826 | 4/2020 |

(Continued)

OTHER PUBLICATIONS

PCT International Search Report and Written Opinion for corresponding Application No. PCT/CN2020/127269, 11 pages.
(Continued)

*Primary Examiner* — Anne M Hines
(74) *Attorney, Agent, or Firm* — Dority & Manning, P.A.

(57) ABSTRACT

A display panel includes a light-emitting substrate, an opposite substrate, and an intermediate layer assembly between the light-emitting substrate and the opposite substrate. The light-emitting substrate has a light-emitting surface configured to allow light to be emitted from, and the light emitted from the light-emitting surface is directed to the opposite substrate. The intermediate layer assembly includes a thin film encapsulation layer, a filler layer, and an overcoat that are sequentially stacked in a pointing direction vertically pointing from the light-emitting substrate to the opposite substrate. The thin film encapsulation layer includes at least two encapsulation sub-layers that are stacked in the pointing direction. In the pointing direction, refractive indexes of the encapsulation sub-layers gradually increase. A refractive index of the overcoat is higher than a refractive index of the filler layer.

19 Claims, 20 Drawing Sheets

(51) Int. Cl.
  *H10K 50/858* (2023.01)
  *H10K 59/122* (2023.01)
  *H10K 59/38* (2023.01)
  *H10K 59/80* (2023.01)

(52) U.S. Cl.
  CPC .......... *H10K 59/122* (2023.02); *H10K 59/38* (2023.02); *H10K 59/873* (2023.02)

(56) References Cited

U.S. PATENT DOCUMENTS

2018/0277609 A1* 9/2018 Fukiwara ............. H10K 50/858
2019/0103450 A1 4/2019 Heo

FOREIGN PATENT DOCUMENTS

| CN | 111384139 | 7/2020 |
| CN | 111653683 | 9/2020 |
| EP | 3493291 A1 | 6/2019 |
| KR | 20200072745 | 6/2020 |

OTHER PUBLICATIONS

Extended European Search Report for corresponding EP Application No. 20960434.7, dated Jul. 21, 2023, 8 pages.

* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2020/127269 filed on Nov. 6, 2020, which is incorporated herein by reference in its entirety.

TECHNICAL FIELD

The present disclosure relates to the field of display technologies, and in particular, to a display panel and a display apparatus.

BACKGROUND

With rapid development of display technologies, self-luminescent display panels, such as organic light-emitting diode (OLED) display panels, have attracted extensive attention due to their advantages of self-luminescence, light and thin structures, high brightness, bright colors and the like.

SUMMARY

In an aspect, a display panel is provided. The display panel includes a light-emitting substrate, an opposite substrate, and an intermediate layer assembly between the light-emitting substrate and the opposite substrate. The light-emitting substrate has a light-emitting surface configured to allow light to be emitted from, and the intermediate layer assembly is configured to direct the light emitted from the light-emitting surface to the opposite substrate. The intermediate layer assembly includes a thin film encapsulation layer, a filler layer, and an overcoat that are sequentially stacked in a pointing direction pointing from the light-emitting substrate to the opposite substrate. The thin film encapsulation layer includes at least two encapsulation sub-layers that are stacked in the pointing direction. In the pointing direction, refractive indexes of the encapsulation sub-layers gradually increase. A refractive index of the overcoat is higher than a refractive index of the filler layer.

In some embodiments, in the pointing direction, thicknesses of the encapsulation sub-layers gradually increase.

In some embodiments, an absolute value of a difference between the refractive index of the filler layer and a refractive index of an encapsulation sub-layer, closest to the filler layer, in the thin film encapsulation layer is in a range of 0 to 0.4, inclusive.

In some embodiments, the refractive index of each encapsulation sub-layer is in a range of 1.7 to 1.9, inclusive.

In some embodiments, a thickness of each encapsulation sub-layer is in a range of 0.6 µm to 1.2 µm, inclusive.

In some embodiments, the refractive index of the filler layer is in a range of 1.5 to 1.7, inclusive, and the refractive index of the overcoat is in a range of 1.7 to 1.85, inclusive.

In some embodiments, a thickness of the filler layer is in a range of 4.0 µm to 8.0 µm, inclusive, and a thickness of the overcoat is in a range of 1.0 µm to 3.0 µm, inclusive.

In some embodiments, the refractive index of the filler layer is higher than a refractive index of an encapsulation sub-layer, closest to the filler layer, in the thin film encapsulation layer.

In some embodiments, the light-emitting substrate includes a first base, a pixel defining layer, a plurality of reflective electrodes arranged at intervals, a light-emitting layer and an electrode layer. The pixel defining layer is located on a side of the first base facing the opposite substrate. The pixel defining layer includes a plurality of first opening portions arranged at intervals, and a pixel defining body surrounding the plurality of first opening portions. The pixel defining body includes a plurality of pixel defining portions, a pixel defining portion is provided between any two adjacent first opening portions, and a surface, facing the opposite substrate, of each of at least one pixel defining portion is provided with at least one first hole. The plurality of reflective electrodes arranged at intervals are in one-to-one correspondence with the plurality of first opening portions, and at least a part of each reflective electrode is exposed by a corresponding first opening portion. The light-emitting layer is configured to emit light of a third color. The light-emitting layer covers the at least the part of each reflective electrode exposed by the corresponding first opening portion and the pixel defining body, and the light of the third color is the light emitted by the light-emitting substrate. The electrode layer covers a surface of the light-emitting layer facing away from the pixel defining layer. A surface of the electrode layer facing away from the light-emitting layer is the light-emitting surface. The opposite substrate includes a plurality of light processing films in one-to-one correspondence with the plurality of first opening portions. The plurality of light processing films includes a plurality of first quantum dot films configured to emit light of a first color upon excitation of the light of the third color, a plurality of second quantum dot films configured to emit light of a second color upon the excitation of the light of the third color, and a plurality of light-transmitting films configured to transmit the light of the third color. The first color, the second color, and the third color constitute three primary colors.

In some embodiments, the at least one first hole and the pixel defining portion provided with the at least one first hole both extend in a first direction, and the first direction is a row direction or a column direction. In a surface of the pixel defining portion provided with the at least one first hole, portions on two opposite sides of each first hole are arc surfaces, and centers of the arc surfaces are each located on a side of the surface facing the first base. A direction pointing from one of the two sides to another side is a second direction perpendicular to the first direction.

In some embodiments, the pixel defining portion provided with the at least one first hole extends in a first direction, and the first direction is a row direction or a column direction. In a second direction perpendicular to the first direction, a dimension of each first hole, is in a range of 2.5% to 30%, inclusive, of a dimension of the pixel defining portion.

In some embodiments, the at least one first hole includes one first hole. The first hole is symmetrical with respect to an axis of the surface of the pixel defining portion provided with the first hole, and the axis is parallel to an extension direction of the pixel defining portion. Or, the at least one first hole includes at least two first holes. A distance between a first first hole and a boundary proximate to the first first hole of the surface of the pixel defining portion provided with the at least two first holes, a distance between any two adjacent first holes, and a distance between a last first hole and a boundary proximate to the last first hole of the surface of the pixel defining portion are all equal.

In some embodiments, each first hole is a groove.

In some embodiments, the opposite substrate further includes a second base and a barrier layer. The barrier layer is located on a side of the second base facing the light-emitting substrate. The barrier layer includes a plurality of second opening portions in one-to-one correspondence with the plurality of first opening portions, and a barrier body surrounding the plurality of second opening portions. The barrier body includes a plurality of banks, a bank is provided between any two adjacent second opening portions, and a surface facing the light-emitting substrate of each of at least one bank is provided with at least one second hole. The plurality of light processing films are located in the plurality of second opening portions in one-to-one correspondence.

In some embodiments, the at least one second hole and the bank provided with the at least one second hole both extend in a first direction, and the first direction is a row direction or a column direction. In the surface of the bank provided with the at least one second hole, portions on two opposite sides of each second hole are arc surfaces, and centers of the arc surfaces are each located on a side of the surface facing the second base. A direction pointing from one of the two sides to another side is a second direction perpendicular to the first direction.

In some embodiments, the bank provided with the at least one second hole extends in a first direction, and the first direction is a row direction or a column direction. In a second direction perpendicular to the first direction, a dimension of each second hole, is in a range of 2.5% to 30%, inclusive, of a dimension of the bank.

In some embodiments, the at least one second hole includes one second hole. The second hole is symmetrical with respect to an axis of the surface of the bank provided with the second hole, and the axis is parallel to an extension direction of the bank. Or, the at least one second hole includes at least two second holes. A distance between a first second hole and a boundary proximate to the first second hole of the surface of the bank provided with the at least two second holes, a distance between any two adjacent second holes, and a distance between a last second hole and a boundary proximate to the last second hole of the surface of the bank are all equal.

In some embodiments, each second hole is a groove.

In some embodiments, in the pointing direction, the plurality of pixel defining portions are in one-to-one correspondence with the plurality of banks, and an orthogonal projection of each pixel defining portion on the first base is within an orthogonal projection of a corresponding bank on the first base. For the pixel defining portion provided with the at least one first hole, a bank corresponding to the pixel defining portion is provided with the at least one second hole, and the at least one first hole and the at least one second hole are arranged in any one of the following manners: the at least one first hole includes one first hole, and the at least one second hole includes one second hole corresponding to the first hole; the at least one first hole includes two first holes arranged at an interval, the at least one second hole includes one second hole, and the second hole corresponds to a region between the two first holes; the at least one first hole includes at least two first holes arranged at interval(s), the at least one second hole includes at least two second holes arranged at interval(s), and each second hole corresponds to a first hole; or the at least one first hole includes one first hole, the at least one second hole includes two second holes arranged at an interval, and a region between the two second holes corresponds to the first hole.

In another aspect, a display apparatus is provided. The display apparatus includes the display panel according to any one of the above embodiments.

BRIEF DESCRIPTION OF THE DRAWINGS

In order to describe technical solutions in the present disclosure more clearly, accompanying drawings to be used in the description of some embodiments of the present disclosure will be introduced briefly below. However, the accompanying drawings to be described below are merely accompanying drawings of some embodiments of the present disclosure, and a person of ordinary skill in the art may obtain other drawings based on these drawings. In addition, the accompanying drawings to be described below may be regarded as schematic diagrams, and are not limitations on actual sizes of products to which the embodiments of the present disclosure relate.

DETAILED DESCRIPTION

Figure 1A:
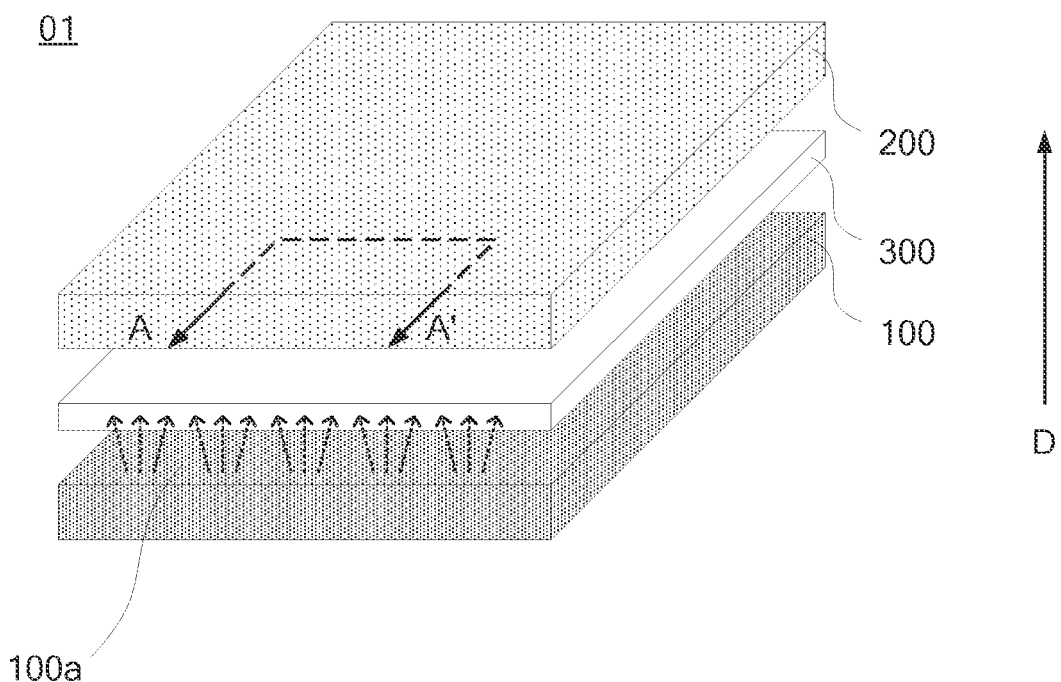
FIG. 1A is an exploded view of a display panel, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure, Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In addition, as used in this description and the appended claims, the singular forms "a/an" and "the" may also include plural referents unless the content clearly dictates otherwise. In the description of the embodiments of the present disclosure, the term "a plurality of" means two or more unless otherwise specified.

It will be understood that, in a case where a layer or an element is described as being "on" another layer or a base, it may be directly on the another layer or the base, or one or more intermediate layers or elements may be present. In addition, it will also be understood that, in a case where a layer or an element is described as being "under" another layer or a base, it may be directly under the another layer or the base, or one or more intermediate layers or elements may be present. Similarly, it will also be understood that, in a case where a layer or an element is described as being between two layers or elements, it may be the only layer or element between the two layers or elements, or one or more intermediate layers may be therebetween.

In the description, the term "thickness" means an average value of thicknesses of various parts of a corresponding element/layer or a general overall thickness of the element/layer.

In the description of some embodiments, the terms "connected" and "coupled" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

In the description, the phrase "at least one of A, B and C" has a same meaning as the phrase "at least one of A, B or C".

That is, they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In the description, the use of the term "configured to" or "applicable to" means an open and inclusive language, which does not exclude devices that are configured to or applicable to perform additional tasks or steps.

The terms such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system). For example, the term "approximately" may mean within one or more standard deviations, or within, for example, ±20%, ±10%, ±5%, or ±3% of the stated value.

Exemplary embodiments are described herein with reference to sectional views as idealized exemplary drawings. Thus, variations in the shown shapes due to, for example, manufacturing technologies and/or tolerances may be envisaged. Therefore, the embodiments described herein should not be construed to be limited to the specific shapes of the regions shown herein, but to include deviations in the shapes due to, for example, manufacturing. For example, regions shown or described as flat may generally have rough and/or non-linear features. In addition, the sharp corners shown may be rounded. Therefore, the regions shown in the accompanying drawings are schematic in nature, and their shapes are not intended to show exact shapes of the regions, and are not intended to limit the scope of the present claims.

A self-luminescent display panel, such as an organic light-emitting diode (OLED) display panel, has a display area. The display area includes a plurality of sub-pixel regions, and each sub-pixel region is provided with a light-emitting device therein.

In the related art, a part of light emitted by a light-emitting film of a light-emitting device in a sub-pixel region is inclined with respect to a normal line (i.e., a virtual line perpendicular to the display panel). In this part of light, light entering a region between adjacent sub-pixel regions cannot be used to display an image, which reduces a light exit rate of the display panel; light entering an adjacent sub-pixel region may cause crosstalk to light exiting from the adjacent sub-pixel region, which in turn causes a decrease in a color gamut of an image that may be displayed by the display panel, and a decrease in a display quality.

Based on this, in order to improve the light exit rate of the display panel and reduce a risk of crosstalk between light emitted from adjacent sub-pixel regions, some embodiments of the present disclosure provide a display panel, which may make light emitted from the display panel converged.

Figure 1B:
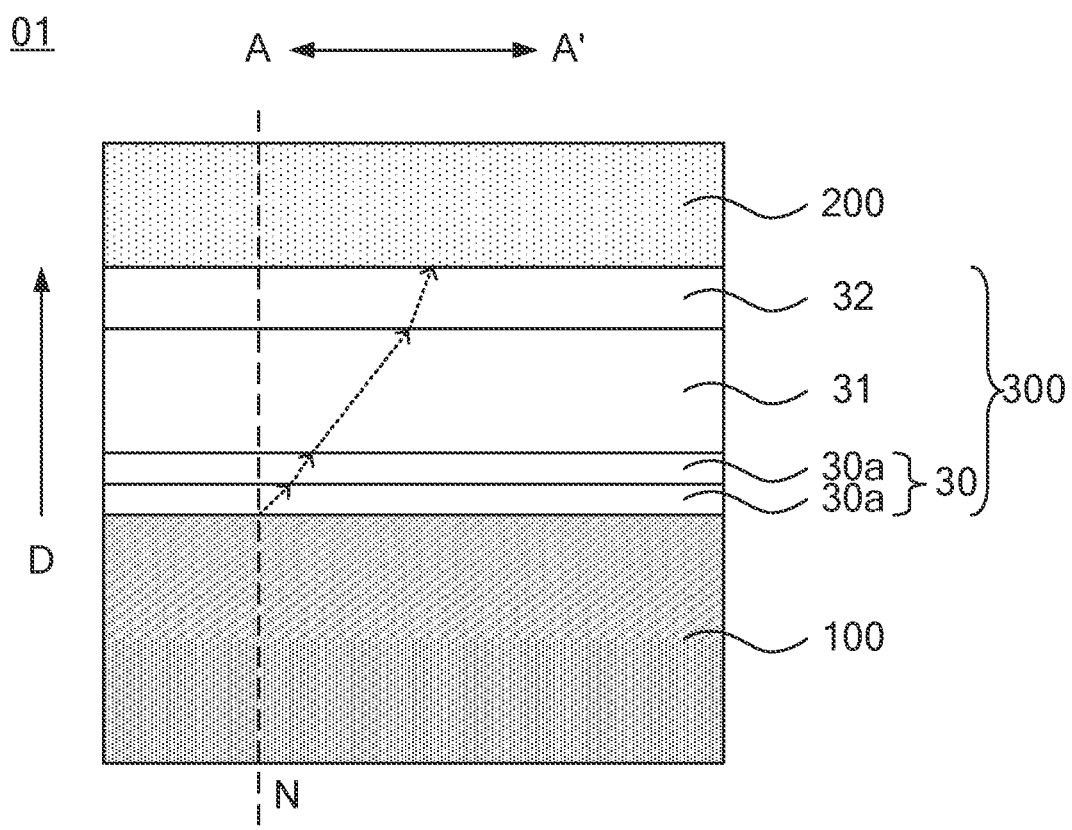
FIG. 1B is a sectional view taken along the section line A-A' in FIG. 1A.

FIG. 1A is an exploded view of the display panel, in accordance with some embodiments. FIG. 1B is a sectional view taken along the section line A-A' in FIG. 1A.

As shown in FIGS. 1A and 1B, the display panel 01 includes a light-emitting substrate 100, an opposite substrate 200, and an intermediate layer assembly 300 between the light-emitting substrate 100 and the opposite substrate 200.

The light-emitting substrate 100 has a light-emitting surface 100*a* configured to allow light to be emitted from. As indicated by the dashed arrows in FIG. 1A, the light emitted from the light-emitting surface 100a is directed to the opposite substrate 200.

The intermediate layer assembly 300 includes a thin film encapsulation layer 30, a filler layer 31 and an overcoat (OC) 32 that are sequentially stacked in a pointing direction D vertically pointing from the light-emitting substrate 100 to the opposite substrate 200.

The thin film encapsulation layer 30 includes at least two encapsulation sub-layers 30a stacked in the pointing direction D. In the pointing direction D, refractive indexes ($n_{30a}$) of the encapsulation sub-layers 30a gradually increase.

A refractive index ($n_{32}$) of the overcoat 32 is higher than a refractive index ($n_{31}$) of the filler layer 31.

It can be understood that, for ease of illustration, in FIGS. 1A and 1B, the light-emitting substrate 100 is represented by only a single layer, and the embodiments of the present disclosure do not limit a specific structure of the light-emitting substrate. The specific structure of the light-emitting substrate 100 will be schematically described in subsequent embodiments.

Similarly, in FIGS. 1A and 1B, the opposite substrate 200 is represented by only a single layer, and the embodiments of the present disclosure do not limit a specific structure of the opposite substrate. The specific structure of the opposite substrate 200 will be schematically described in subsequent embodiments. In addition, the light-emitting substrate 100 may also be referred to as a back plate, and correspondingly, the opposite substrate 200 may also be referred to as a cover plate.

In addition, for ease of description, an assembly composed of the thin film encapsulation layer 30, the filler layer 31 and the overcoat 32 that are sequentially stacked is referred to as the intermediate layer assembly 300, but it does not mean that these layers need to be sequentially formed in the above stacking order. The embodiments of the present disclosure do not limit the order in which these layers are formed, as long as positions of these layers satisfy the above stacking order.

For example, the thin film encapsulation layer 30 is formed on a side of the light-emitting substrate 100 facing the opposite substrate 200, the overcoat 32 is formed on a side of the opposite substrate 200 facing the light-emitting substrate 100, and a plurality of post spacers (PSs) arranged at intervals are arranged on a side of the overcoat 32 facing the light-emitting substrate 100. After the light-emitting substrate 100 and the opposite substrate 200 are assembled, a certain space will be formed between the two substrates due to support of structures such as the PSs. Afterwards, a fluid-like filler material with a certain viscosity is coated on a surface of the thin film encapsulation layer 30 in a circling manner by means of, for example, an injection device, and the filler material is diffused to form the filler layer 31 by virtue of fluidity of the fluid, so that the thin film encapsulation layer 30 and the overcoat 32 are bonded together.

It can also be understood that, the intermediate layer assembly 300 is disposed on the light-emitting surface 100a of the light-emitting substrate 100, and the light emitted from the light-emitting surface 100a is used to display at least an image that may be seen by human eyes; thus, the layers in the intermediate layer assembly 300 are all light-transmitting layers, that is, they each have a certain transmittance to visible light.

In an optical path shown by the dashed line in FIG. 1B, when the light emitted by the light-emitting substrate 100 is inclined with respect to a normal line N, since the refractive indexes $n_{30a}$ of the encapsulation sub-layers 30a in the thin film encapsulation layer 30 gradually increase in the pointing direction D, after the inclined light enters an encapsulation sub-layer 30a with a high refractive index from another encapsulation sub-layer 30a with a low refractive index, based on a formula of a relative refractive index, it can be seen that, an inclination angle of light exiting from the encapsulation sub-layer 30a with the high refractive index may be reduced, so that a proportion of light exiting in a direction of the normal line N is increased. Similarly, since the refractive index $n_{32}$ of the overcoat 32 is higher than the refractive index $n_{31}$ of the filler layer 31, an inclination angle of light passing through the filler layer 31 and then entering the overcoat 32 may also be reduced, so that the proportion of the light exiting in the direction of the normal line N is increased.

In some embodiments, thicknesses of encapsulation sub-layers 30a gradually increase in the pointing direction D. It can be seen from the foregoing description that, the refractive indexes $n_{30a}$ of encapsulation sub-layers 30a gradually increase in the pointing direction D. That is to say, the higher the refractive index of the encapsulation sub-layer 30a is, the larger the thickness thereof is.

As a result, in the thin film encapsulation layer 30, an optical path (i.e., a route through which light passes) in the encapsulation sub-layer 30a with the high refractive index is longer than an optical path in the encapsulation sub-layer 30a with the low refractive index, so that light entering the encapsulation sub-layer 30a with the high refractive index may be sufficiently deflected to the normal line.

It can be understood that, in the embodiments of the present disclosure, a thickness of a layer or film refers to a dimension of the layer or film in the pointing direction D.

In some embodiments, the refractive index $n_{30a}$ of each encapsulation sub-layer 30a is in a range of 1.7 to 1.9, inclusive. That is, $n_{30a}$ is greater than or equal to 1.7 and less than or equal to 1.9 ($1.7 \leq n_{30a} \leq 1.9$).

It will be noted that, a same medium has different refractive indexes for light at different frequencies (i.e., light with different wavelengths). A refractive index of a medium that is transparent to the visible light generally increases as a wavelength of the visible light decreases. Therefore, when refractive indexes of different materials are described, they all refer to refractive indexes of these materials relative to light with a same wavelength, so as to facilitate to compare the refractive indexes of the different materials at a same measurement standard. Generally, refractive indexes of various materials are described relative to green light with a wavelength of 550 nm.

Obviously, it can also be understood that, specific values of refractive indexes of all materials mentioned in the embodiments of the present disclosure are described only relative to, for example, the green light with the wavelength of 550 nm. However, it does not mean that the light emitted by the light-emitting substrate 100 in the display panel 01 provided by the embodiments of the present disclosure can only be the green light.

An encapsulation sub-layer 30a may be made of silicon oxide ($SiO_x$, a refractive index of which is approximately 1.7), silicon oxynitride (SiON, a refractive index of which is approximately 1.8), or silicon nitride ($SiN_y$, a refractive index of which is approximately 1.9). Two or three materials described above may be selected as needed to form the encapsulation sub-layers 30a in the thin film encapsulation layer 30, and the encapsulation sub-layers 30a are combined based on the refractive indexes from low to high.

For example, the thin film encapsulation layer 30 includes a layer of $SiO_x$ and a layer of SiON that are sequentially stacked in the pointing direction D. Alternatively, the thin film encapsulation layer 30 includes a layer of $SiO_x$ and a layer of $SiN_y$ that are sequentially stacked in the pointing direction D. Alternatively, the thin film encapsulation layer 30 includes a layer of $SiO_x$, a layer of SiON and a layer of $SiN_y$ that are sequentially stacked in the pointing direction D.

Each encapsulation sub-layer 30a may be formed by using, for example, a chemical vapor deposition (CVD) method.

Herein, the subscripts x and y in the chemical formulas "$SiO_x$" and "$SiN_y$" respectively represent the number of oxygen atoms (O) in a silicon oxide molecule and the number of nitrogen atoms (N) in a silicon nitride molecule. Depending on different formation conditions of silicon oxide and silicon nitride, such as a ratio among reaction sources, air pressure and temperature in the CVD process, values of x and y are also different, which are not limited in the embodiments of the present disclosure.

In some embodiments, the thickness ($T_{30a}$) of each encapsulation sub-layer is in a range of 0.6 μm to 1.2 μm, inclusive. That is, $T_{30a}$ is greater than or equal to 0.6 μm and less than or equal to 1.2 μm (0.6 μm≤$T_{30a}$≤1.2 μm). For example, a thickness $T_{30a}$ of an encapsulation sub-layer 30a is 0.6 μm, 0.8 μm, 1.0 μm or 1.2 μm.

It can be understood that, in a case where an encapsulation sub-layer 30a with a higher refractive index has a larger thickness, in the thin film encapsulation layer 30, a thickness of an encapsulation sub-layer 30a with a largest thickness and a thickness of an encapsulation sub-layer 30a with a smallest thickness are both in the above range.

Furthermore, a material of the filler layer 31 needs to have a certain viscosity and light transmittance. Therefore, in some embodiments, comprehensively considering the material of the filler layer 31 and a design effect of the optical path of the intermediate layer assembly 300, an absolute value (AV) of a difference between the refractive index $n_{31}$ of the filler layer 31 and a refractive index $n_{30a}$ of an encapsulation sub-layer 30a, closest to the filler layer 31, in the thin film encapsulation layer 30 is in a range of 0 to 0.4, inclusive. That is, AV is greater than or equal to 0 and less than or equal to 0.4 (0≤AV≤0.4).

That is to say, the refractive index $n_{31}$ of the filler layer 31 may be higher or lower than the refractive index $n_{30a}$ of the encapsulation sub-layer 30a closest thereto by 0.4, and $n_{31}$ may be close to $n_{30a}$.

In this way, in a case where the refractive index $n_{31}$ of the filler layer 31 is lower than the refractive index $n_{30a}$ of the encapsulation sub-layer 30a closest thereto by 0.4, it may be possible to avoid excessive deflection of the light caused by an excessive large difference between the refractive index of the filler layer 31 and the refractive index of the encapsulation sub-layer 30a closest thereto, when the light enters the filler layer 31 from the encapsulation sub-layer 30a closest thereto.

In some embodiments, the refractive index $n_{31}$ of the filler layer 31 is in a range of 1.5 to 1.7, inclusive. That is, $n_{31}$ is greater than or equal to 1.5 and less than or equal to 1.7 (1.5≤$n_{31}$≤1.7). For example, it may be 1.5, 1.6 or 1.7. The filler layer 31 may be made of an organic material with a certain viscosity and light transmittance, such as epoxy resin or acrylic resin.

In some embodiments, the refractive index $n_{32}$ of the overcoat is in a range of 1.7 to 1.85, inclusive. That is, $n_{32}$ is greater than or equal to 1.7 and less than or equal to 1.85 (1.7≤$n_{32}$≤1.85). For example, it may be 1.7, 1.75, 1.8 or 1.85.

A material of the overcoat 32 needs to have a certain viscosity, light transmittance and a good coverage, so that in a case where the overcoat 32 is formed on the side of the opposite substrate 200 facing the light-emitting substrate 100 (or a surface of another layer), a flat surface may be formed. As a result, light passing through the overcoat 32 may exit uniformly, or other structures may be uniformly covered, or a flat surface may be provided for other structures subsequently formed on the overcoat 32, which facilitates formation of the subsequent structures. In addition, the overcoat 32 also needs to have a higher refractive index $n_{32}$ than the refractive index $n_{31}$ of the filler layer 31.

Therefore, comprehensively considering the material of the overcoat 32 and the design effect of the optical path of the intermediate layer assembly 300, for example, the material for forming the overcoat 32 includes an organic material with a certain viscosity and light transmittance, and scattering particles dispersed in the organic material in a certain proportion. The organic material is, for example, epoxy resin or acrylic resin, and the scattering particles are, for example, nanocrystalline particles such as zirconium dioxide ($ZrO_2$), titanium dioxide ($TiO_2$), zinc oxide (ZnO) or barium sulfate ($BaSO_4$).

It will be noted that, the overcoat 32 needs to have a higher refractive index $n_{32}$ than the refractive index $n_{31}$ of the filler layer 31, so as to make light exiting from the overcoat 32 deflected to the normal line, but it is difficult for a conventional light-transmitting organic material to have a refractive index that satisfies the above condition. However, by doping the nanocrystalline particles into the organic material, the formed overcoat 32 may have a high refractive index, and due to a scattering effect of the nanocrystalline particles, the overcoat 32 may also have a certain light extraction effect.

Herein, since the material that the overcoat 32 is made of includes the organic material and the nanocrystalline particles dispersed therein, the refractive index of the overcoat 32 is a comprehensive value obtained after calculation based on refractive indexes of the organic material and the nanocrystalline particles, a dispersion ratio of the nanocrystalline particles in the organic material and other parameters.

In some embodiments, since the filler layer 31 has a certain viscosity, and it is difficult to spread out uniformly in a case where its thickness is excessively small, its thickness $T_{31}$ is in a range of 4.0 μm to 8.0 μm, inclusive. That is, $T_{31}$ is greater than or equal to 4.0 μm and less than or equal to 8.0 μm (4.0 μm≤$T_{31}$≤8.0 μm). For example, it may be 4.0 μm, 4.5 μm, 5.0 μm, 5.5 μm, 6.0 μm, 6.5 μm, 7.0 μm, 7.5 μm or 8.0 μm. Optionally, the thickness $T_{31}$ is greater than or equal to 5.0 μm and less than or equal to 6.0 μm (5.0 μm≤$T_{31}$≤6.0 μm). The thickness $T_{31}$ of the filler layer 31 may be adjusted, for example, by controlling the number of rotations and/or a distance between circles when the filler material is coated, which is not limited in the embodiments of the present disclosure.

In some embodiments, a thickness $T_{32}$ of the overcoat 32 is in a range of 1.0 μm to 3.0 μm, inclusive. That is, $T_{32}$ is greater than or equal to 1.0 μm and less than or equal to 3.0 μm (1.0 μm≤$T_{32}$≤3.0 μm). For example, it may be 1.0 μm, 1.5 μm, 2.0 μm, 2.5 μm or 3.0 μm. For example, the overcoat 32 may be formed through a spin coating process.

It can be seen from the foregoing description that, the light entering the intermediate layer assembly 300 first enters the thin film encapsulation layer 30, and the encapsulation sub-layer 30a with the high refractive index and a large thickness in the thin film encapsulation layer 30 enables the light to be sufficiently deflected first. In this case, in the intermediate layer assembly 300, the overcoat 32 that is farthest away from the light-emitting substrate 100 may have a small thickness to reduce an overall thickness of the intermediate layer assembly 300. As a result, it may be possible to avoid crosstalk caused by light in a sub-pixel region extending to an adjacent sub-pixel region when it is directed to the overcoat 32.

In some examples, the thin film encapsulation layer 30 includes two encapsulation sub-layers 30a, and the thickness $T_{30a}$ of each encapsulation sub-layer 30a is in the range of 0.6 µm to 1.2 µm, inclusive. The thickness $T_{31}$ of the filler layer 31 is in the range of 4.0 µm to 8.0 µm, inclusive. The thickness $T_{32}$ of the overcoat 32 is in the range of 1.0 µm to 3.0 µm, inclusive. The overall thickness of the intermediate layer assembly 300 is in a range of 6.2 µm to 13.4 µm, inclusive.

In some other examples, the thin film encapsulation layer 30 includes three encapsulation sub-layers 30a, and the thickness $T_{30a}$ of each encapsulation sub-layer 30a is in the range of 0.6 µm to 1.2 µm, inclusive. The thickness $T_{31}$ of the filler layer 31 is in the range of 4.0 µm to 8.0 µm, inclusive. The thickness $T_{32}$ of the overcoat 32 is in the range of 1.0 µm to 3.0 µm, inclusive. The overall thickness of the intermediate layer assembly 300 is in a range of 6.8 µm to 14.6 µm, inclusive.

In some other embodiments, the refractive index of the filler layer 31 is higher than the refractive index $n_{30a}$ of the encapsulation sub-layer 30a, closest to the filler layer 31, in the thin film encapsulation layer 30.

In the pointing direction D, the refractive indexes $n_{30a}$ of the encapsulation sub-layers 30a gradually increase, and the refractive index $n_{32}$ of the overcoat 32 is higher than the refractive index $n_{31}$ of the filler layer 31. Therefore, in a case where the refractive index of the filler layer 31 is higher than the refractive index $n_{30a}$ of the encapsulation sub-layer 30a closest thereto, the refractive indexes of the layers in the intermediate layer assembly 300 gradually increase in the pointing direction D.

As a result, after the light inclined with respect to the normal line N before entering the intermediate layer assembly 300 passes through the intermediate layer assembly 300 and then exits, an inclination angle of the light may be reduced, which facilitates convergence of the light.

The thin film encapsulation layer 30, the filler layer 31 and the overcoat 32 may each be made of a corresponding material, so that the layers meet the requirement of having gradually increased refractive indexes, and details will not be repeated herein.

Further, in the following embodiments, the specific structures of the light-emitting substrate 100 and the opposite substrate 200 in the display panel 01 will be described in detail.

Figure 2:
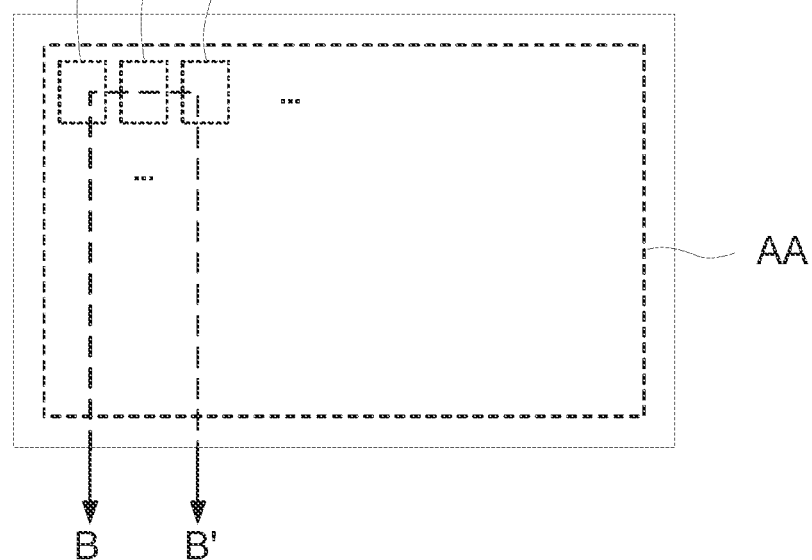
FIG. 2 is a diagram showing a structure of a display panel, in accordance with some embodiments.

FIG. 2 is a diagram showing a structure of the display panel 01, in accordance with some embodiments. As shown in FIG. 2, the display panel 01 has a display area AA, which includes a plurality of sub-pixel regions (Sub-P1, Sub-P2, and Sub-P3).

FIGS. 3A to 3D are sectional views taken along the section line B-B' in FIG. 2. As shown in FIGS. 3A to 3D, the light-emitting substrate 100 includes a first base 10 and a plurality of structures on a side of the first base 10 facing the opposite substrate 200.

The plurality of structures include a pixel defining layer (PDL) 13 (shown in FIG. 4A), a plurality of reflective electrodes D1 arranged at intervals, a light-emitting layer 14 configured to emit light of a third color, and an electrode layer 15. The plurality of reflective electrodes D1, the light-emitting layer 14 and the electrode layer 15 define a plurality of light-emitting devices D.

In some examples, the plurality of structures further include a pixel circuit layer 11 disposed on the side of the first base 10 facing the opposite substrate 200, and a planarization (PLN) layer 12 disposed on a side of the pixel circuit layer 11 facing the opposite substrate 200. The pixel defining layer 13 and the plurality of light-emitting devices D are disposed on a side of the planarization layer 12 facing the opposite substrate 200.

In some examples, the plurality of structures further include a buffer layer between the first base 10 and the pixel circuit layer 11. The buffer layer may prevent metal atoms or impurity ions from diffusing into the pixel circuit layer 11 from the first base 10.

The plurality of structures arranged in the pointing direction D will be described in detail below.

The first base 10 may be a rigid base, which is made of, for example, glass. Alternatively, the first base 10 is a flexible base, which is made of, for example, polyimide (PI), polyethylene terephthalate (PET), polycarbonate (PC), polymethyl methacrylate (PMMA), or polyethersulfone resin (PES).

The pixel circuit layer 11 includes a plurality of pixel driver circuits, and each pixel driver circuit is electrically connected to a light-emitting device D. Each pixel driver circuit includes a plurality of transistors (e.g., thin film transistors (TFTs)) and at least one storage capacitor.

FIGS. 3A to 3D show only one TFT directly connected to a reflective electrode D1 in a light-emitting device D through a through hole in the planarization layer 12, and a specific structure of the TFT is not shown in detail.

Figure 3A:
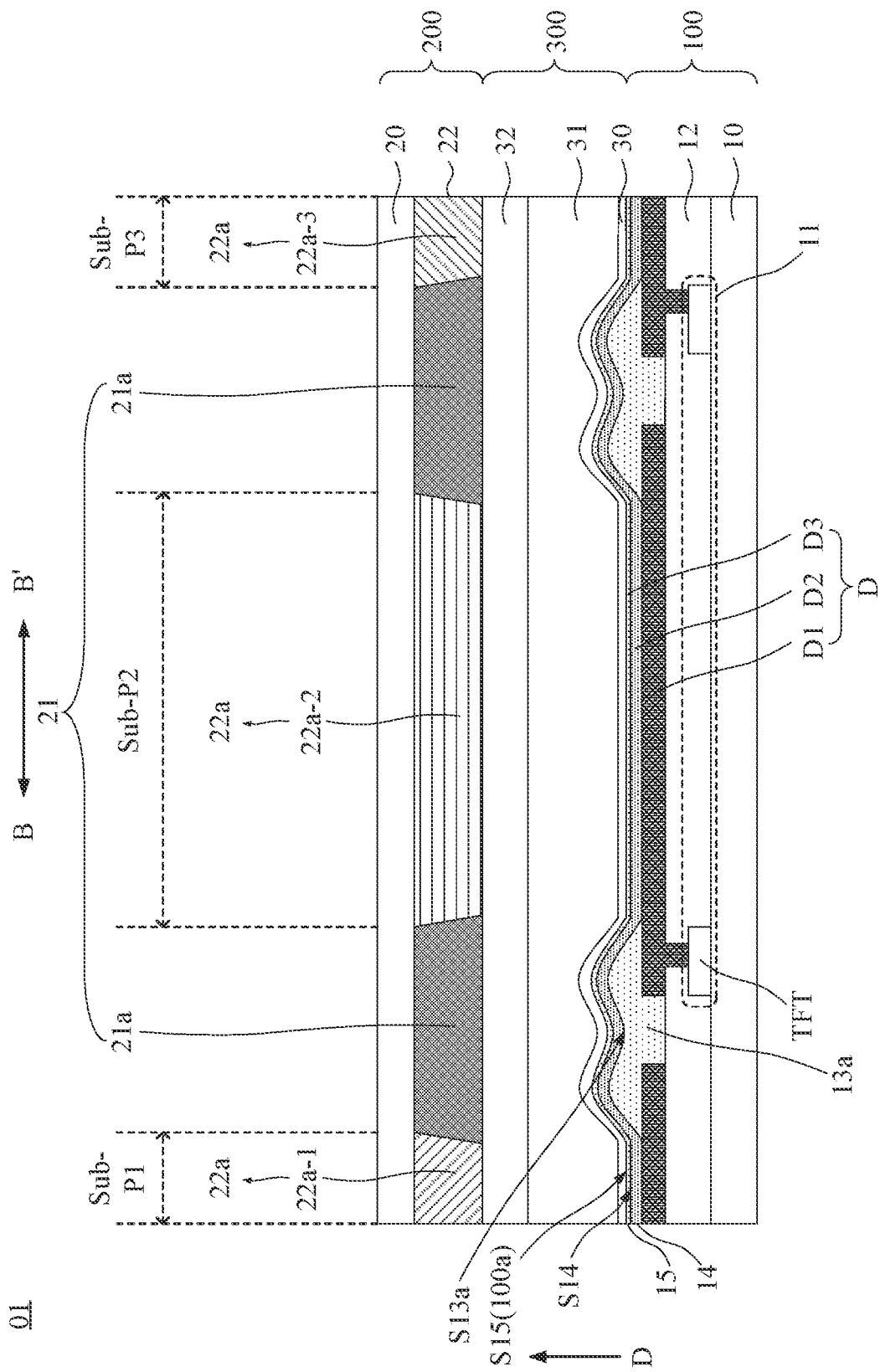
FIG. 3A is a sectional view taken along the section line B-B' in FIG. 2.
Figure 3B:
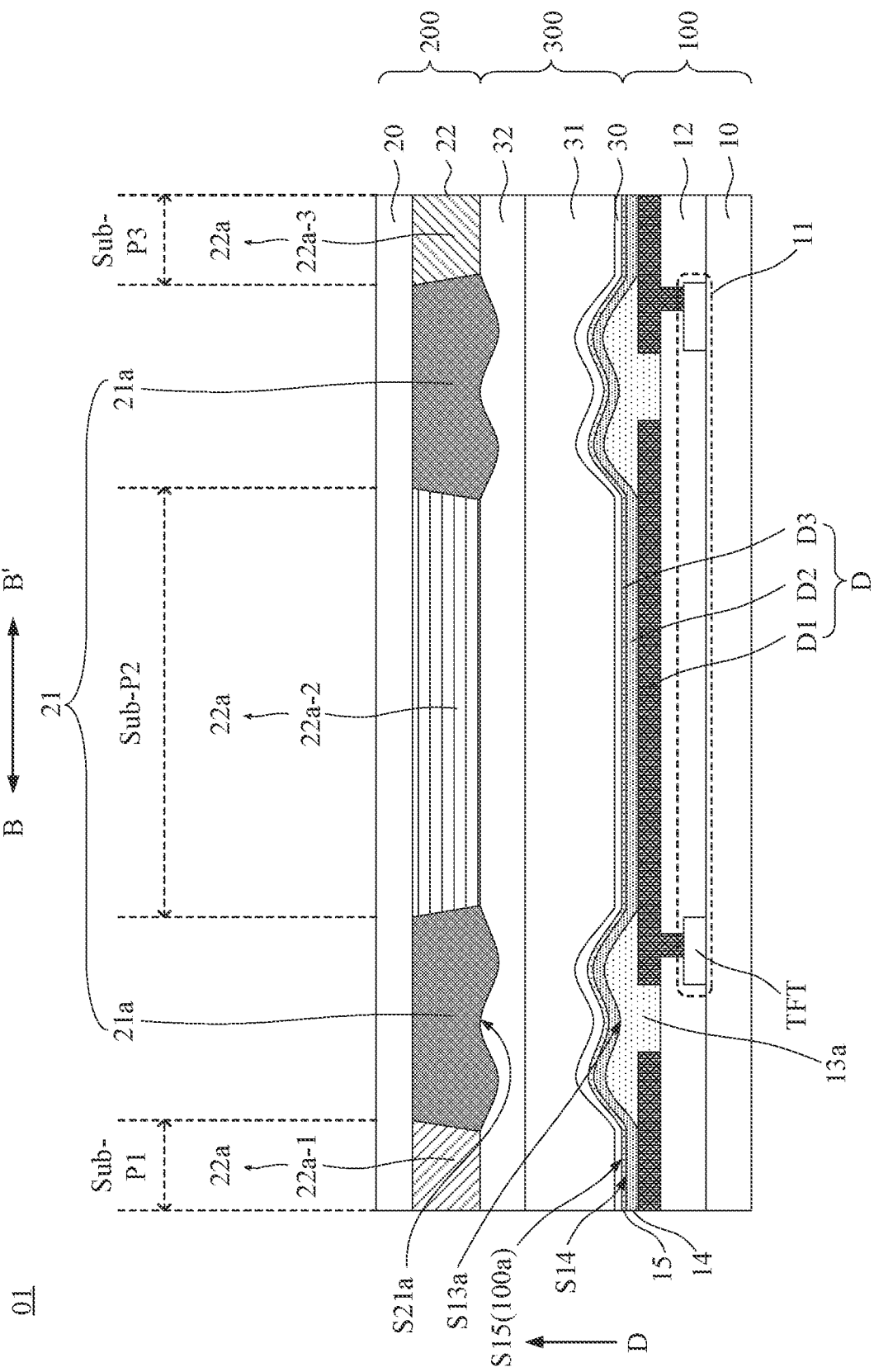
FIG. 3B is another sectional view taken along the section line B-B' in FIG. 2.
Figure 3C:
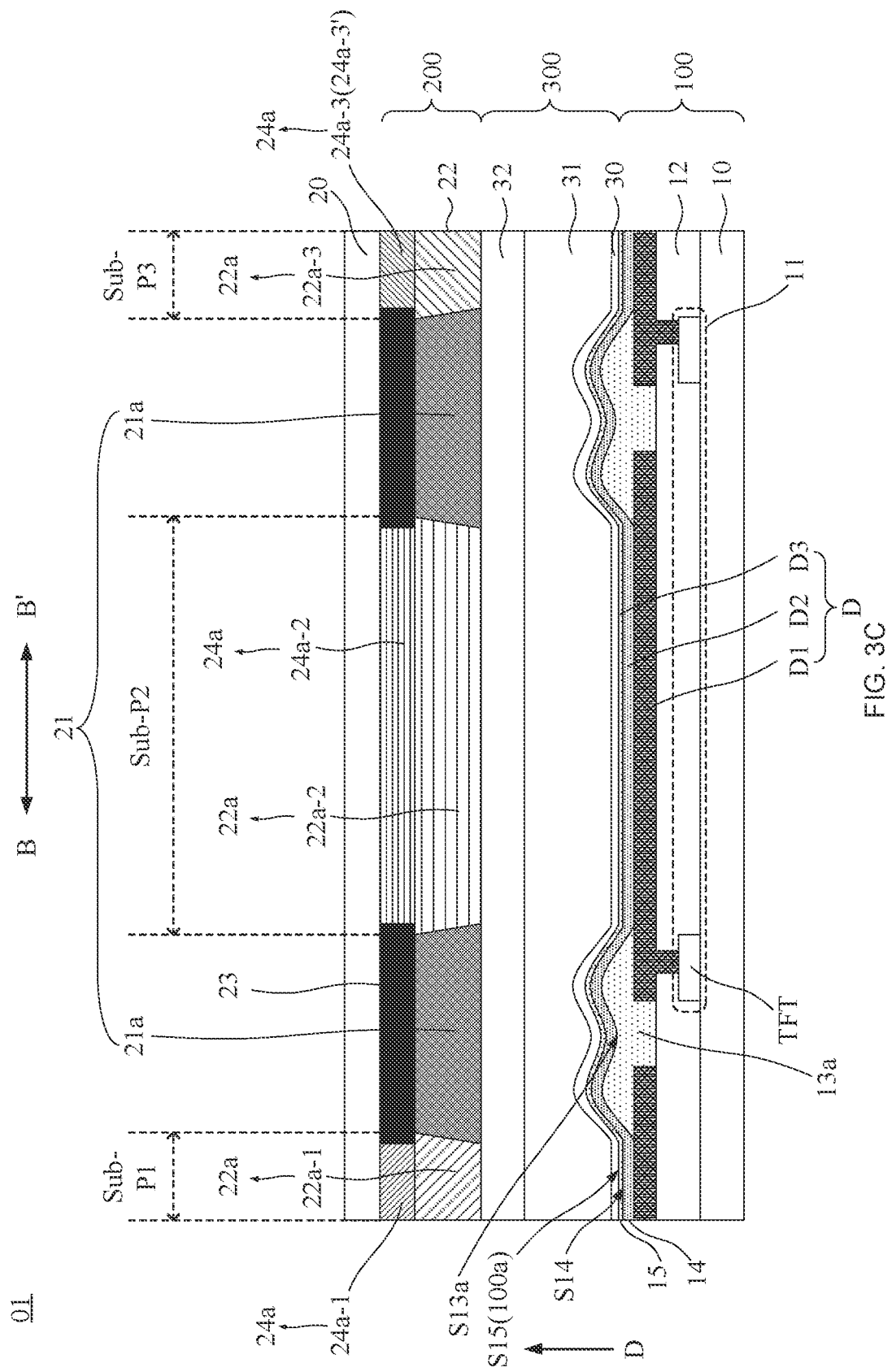
FIG. 3C is yet another sectional view taken along the section line B-B' in FIG. 2.
Figure 3D:
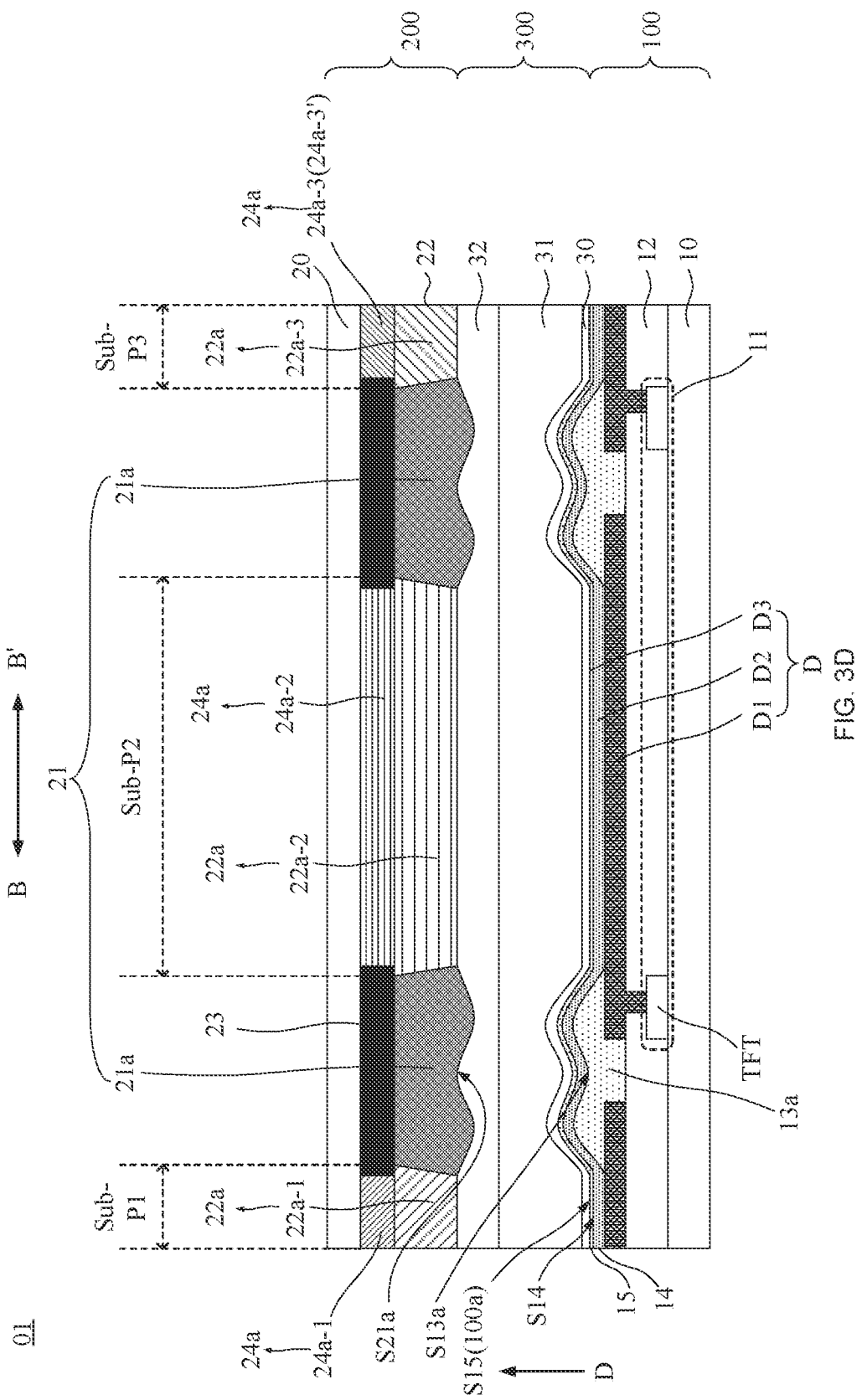
FIG. 3D is yet another sectional view taken along the section line B-B' in FIG. 2.
Figure 4A:
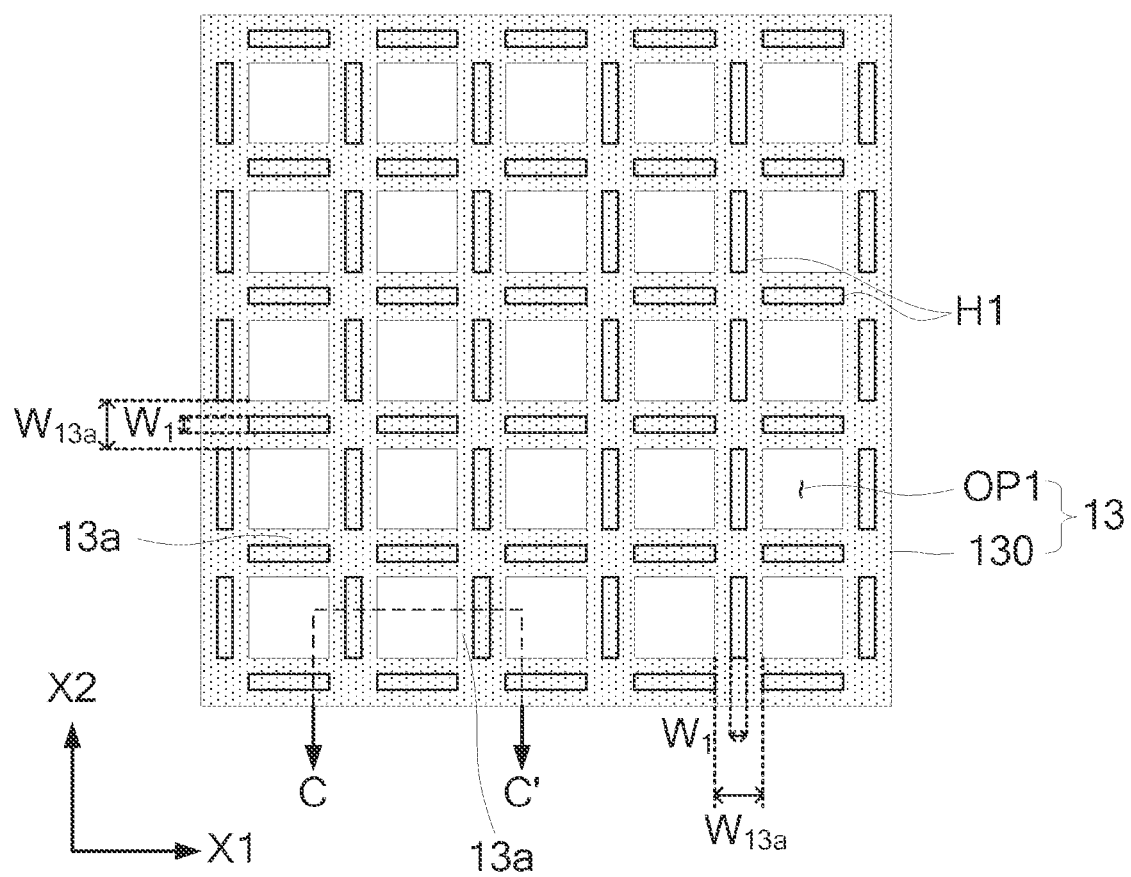
FIG. 4A is a diagram showing a structure of a pixel defining layer, in accordance with some embodiments.
Figure 4B:
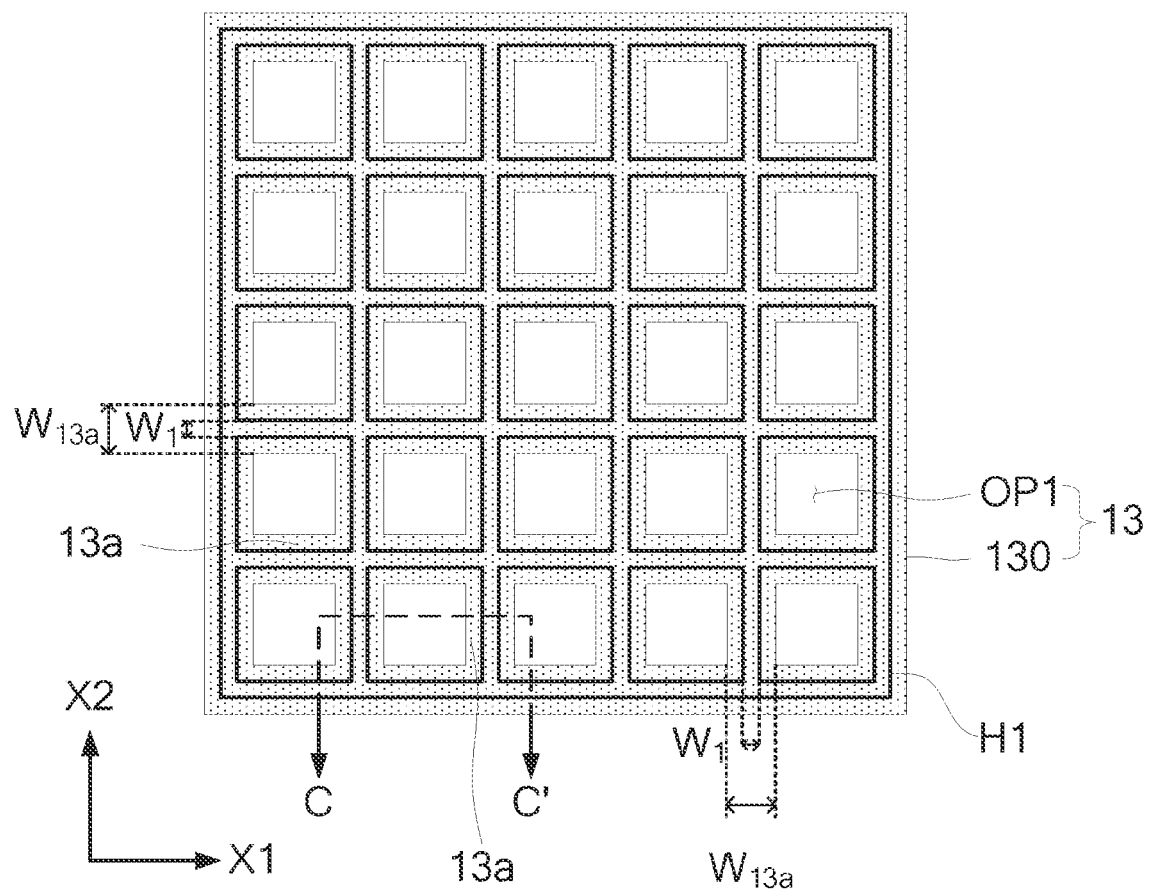
FIG. 4B is a diagram showing a structure of another pixel defining layer, in accordance with some embodiments.

FIGS. 4A to 4D are diagrams showing structures of the pixel defining layer 13 in the light-emitting substrate 100, in accordance with some embodiments, and a sectional direction in FIGS. 3A to 3D also corresponds to the C-C' direction in FIGS. 4A and 4B.

As shown in FIGS. 4A to 4D, the pixel defining layer 13 includes a plurality of first opening portions OP1 arranged at intervals, and a pixel defining body 130 surrounding the plurality of first opening portions OP1. The pixel defining body 130 includes a plurality of pixel defining portions 13a, and a pixel defining portion 13a is provided between any two adjacent first opening portions OP1.

The pixel defining layer 13 defines a plurality of sub-pixel regions, that is, each first opening portion OP1 is in a sub-pixel region.

It can be understood that, in the pixel defining layer 13 shown in FIGS. 4A to 4D, shapes (i.e., shapes of cross sections parallel to a surface of the first base 10), the number, an arrangement and other setting manners of the first opening portions OP1 are only for illustration, and are not limited in the embodiments of the present disclosure.

The shape of the first opening portion OP1 is not necessarily a rectangle. For example, the shape of the first opening portion OP1 may be designed as a rhombus, a pentagon, a hexagon, a circle, an ellipse, an irregular shape or the like according to display requirements.

The shapes of the first opening portions OP1 are not necessarily the same. For example, shapes of first opening portions OP1 corresponding to sub-pixel regions of a same type (e.g., red sub-pixel regions, green sub-pixel regions, or blue sub-pixel regions) may be designed to be exactly the same, and shapes of first opening portions OP1 corresponding to sub-pixel regions of different types are different. For example, a shape of first opening potions OP1 corresponding to the red sub-pixel regions, a shape of first opening portions OP1 corresponding to the blue sub-pixel regions, and a shape of first opening portions OP1 corresponding to the green sub-pixel regions are different from each other.

The plurality of first opening portions OP1 are not necessarily arranged in an array in a row direction (X1) and a column direction (X2). For example, the plurality of first opening portions OP1 may also be arranged in the following way: in any two adjacent rows of first opening portions OP1, each first opening portion OP1 in a row of first opening portions OP1 vertically corresponds to a region between two first opening portions OP1, adjacent to this first opening portion, in the other row of first opening portions OP1. In this way, the sub-pixel regions of the display panel 01 may be arranged in a delta (Δ) manner.

As shown in FIGS. 3A to 3D, the plurality of reflective electrodes D1 arranged at intervals are located on a side of the pixel defining layer 13 facing the first base 10, and are in one-to-one correspondence with the plurality of first opening portions OP1.

For example, the plurality of reflective electrodes D1 may be formed first, and then the pixel defining layer 13 is formed, so that at least a part of a region of each reflective electrode D1 is exposed by a corresponding first opening portion OP1. In some examples, as shown in FIGS. 3A to 3D, an edge of each reflective electrode D1 is covered by the pixel defining layer 13, so that most of the region of the reflective electrode D1 is exposed by a corresponding first opening portion OP1.

In some other examples, each reflective electrode D1 is fully exposed by a corresponding first opening portion OP1, that is, each reflective electrode D1 is located in a corresponding first opening portion OP1.

In yet some other examples, the pixel defining layer 13 may be formed first, and then a reflective electrode D1 is formed in each first opening portion OP1 correspondingly. In this way, each reflective electrode D1 is located in a corresponding first opening portion OP1, and may further extend to a sidewall of the pixel defining body 13 enclosing the first opening portion OP1. This is not limited in the embodiments of the present disclosure.

The reflective electrodes D1 arranged at intervals may be formed as follows. A conductive layer is deposited on the planarization layer 12 through a sputtering process, and a photoresist layer is formed on a side of the conductive layer away from the planarization layer 12 through a spin coating process. The photoresist layer is sequentially subjected to pre-baking, exposure, development and other processing by using a mask to form a photoresist pattern. The photoresist pattern has openings exposing a part of a region of the conductive layer. With the photoresist pattern as a mask, etching (e.g., wet etching) is performed on the exposed region of the conductive layer, that is, the conductive layer is patterned, so as to form the plurality of reflective electrodes D1 arranged at intervals.

As shown in FIGS. 3A to 3D, the light-emitting layer 14 covers at least the part of the region of each reflective electrode D1 exposed by the corresponding first opening portion OP1 and the pixel defining body 130.

For example, by using an open mask, the light-emitting layer 14 may be deposited in the plurality of first opening portions OP1 and on a surface S130 of the pixel defining body 130 facing the opposite substrate, and extend into first holes H1 through an evaporation process. In this way, it may be possible to facilitate manufacturing of a large-sized light-emitting substrate 100.

Herein, the open mask is generally loop-shaped, and a large-area hollowed-out region in a middle covers the display area AA, so that the light-emitting layer 14 is continuously deposited over the first base 10 and in a region within the display area AA.

As shown in FIGS. 3A to 3D, the electrode layer 15 covers a surface S14 of the light-emitting layer 14 facing away from the pixel defining layer 13. A surface S15 of the electrode layer 15 facing away from the light-emitting layer 14 is a light-emitting surface 100a of the light-emitting substrate 100. Since the electrode layer 15 is a whole layer, it may be formed through a sputtering process without a patterning process.

For ease of description, for each reflective electrode D1, a portion of the light-emitting layer 14 covering the reflective electrode D1 is referred to as a light-emitting film D2, and for each light-emitting film D2, a portion of the electrode layer 15 covering the light-emitting film D2 is referred to as an opposite electrode D3. In this way, as shown in FIGS. 3A to 3D, each reflective electrode D1, and a light-emitting film D2 and an opposite electrode D3 that are on a side of the reflective electrode D1 facing the opposite substrate 200 together constitute a basic structure of a light-emitting device D.

Each light-emitting device D is, for example, an OLED. In a case where the reflective electrode D1 is an anode, the opposite electrode D3 is a cathode; conversely, in a case where the reflective electrode D1 is a cathode, the opposite electrode D3 is an anode. When different voltages are applied to the reflective electrode D1 and the opposite electrode D3, an electric field may exist therebetween, and the light-emitting film D2 may emit the light of the third color under control of the electric field. A specific light-emitting principle will not be described in detail herein.

The opposite electrode D3 generally has a certain transmittance and reflectivity to light. That is, the opposite electrode D3 is generally made of a transflective material or a partially transflective material. A part of light emitted by the light-emitting film D2 that reaches the reflective electrode D1 may be reflected by the reflective electrode D1, and then exits from the opposite electrode D3.

Therefore, the light-emitting device D is a top-emitting device, that is, it emits light upward relative to the first base 10. In contrast, the light-emitting device D is a bottom-emitting device, that is, it emits light downward relative to the base provided with the bottom-emitting device.

For example, each light-emitting device D may further include at least one of: a first carrier injection film and a first carrier transport film that are sequentially disposed between a reflective electrode D1 of the light-emitting device and a light-emitting film D2 of the light-emitting device in the pointing direction D, and a second carrier transport film and a second carrier injection film that are sequentially disposed between the light-emitting film D2 of the light-emitting device and an opposite electrode D3 of the light-emitting device in the pointing direction D.

It will be noted that, in a case where the reflective electrode D1 is the anode and the opposite electrode D3 is the cathode, the first carrier injection film, the first carrier transport film, the second carrier transport film and the second carrier injection film are sequentially a hole injection film, a hole transport film, an electron transport film and an electron injection film; conversely, in a case where the reflective electrode D1 is the cathode and the opposite electrode D3 is the anode, the first carrier injection film, the first carrier transport film, the second carrier transport film, and the second carrier injection film are sequentially an electron injection film, an electron transport film, a hole transport film and a hole injection film.

That is to say, a type of first carriers is the same as a type of carriers that the reflective electrode D1 can provide due to an action of an applied corresponding voltage. Similarly, a type of second carriers is the same as a type of carriers that the opposite electrode D3 can provide due to an action of an applied corresponding voltage.

Moreover, light-emitting films D2 of the plurality of light-emitting devices D are connected to each other to form the light-emitting layer 14 of an integral structure. Therefore, in a case where each light-emitting device further includes the first carrier injection film, first carrier injection films of the plurality of light-emitting devices D are connected to each other to form a first carrier injection layer of an integral structure, which may be formed through evaporation or other processes.

Similarly, in a case where each light-emitting device D further includes the first carrier transport film, first carrier transport films of the plurality of light-emitting devices D are connected to each other to form a first carrier transport layer of an integral structure, which may be formed through evaporation or other processes.

Similarly, in a case where each light-emitting device D further includes the second carrier injection film, second carrier injection films of the plurality of light-emitting devices D are connected to each other to form a second carrier injection layer of an integral structure, which may be formed through evaporation or other processes.

Similarly, in a case where each light-emitting device D further includes the second carrier transport film, second carrier transport films of the plurality of light-emitting devices D are connected to each other to form a second carrier transport layer of an integral structure, which may be formed through evaporation or other processes.

Considering an example in which the reflective electrode D1 is the anode, the reflective electrode D1 includes, for example, a layer of indium tin oxide (ITO) with a thickness of 0.008 μm (80 Å), and a layer of silver (Ag) with a thickness of 0.1 μm (1000 Å), and a layer of ITO with a thickness of 0.012 μm (120 Å).

Considering an example in which the opposite electrode D3 is the cathode, the opposite electrode D3 is, for example, a layer of magnesium-silver alloy (MgAg) with a thickness in a range of 0.008 μm to 0.012 μm (in a range of 80 Å to 120 Å) inclusive.

As can be seen from the foregoing description, in the display panel 01 provided by the embodiments of the present disclosure, the light-emitting device D is the top-emitting device. Therefore, the pixel circuit layer 11 on a side of the light-emitting device D facing the first base 10 does not block the light emitted by the light-emitting device D. As a result, it may be possible to effectively solve a problem of reduction of an aperture ratio and brightness of the display panel caused by complicated pixel driver circuits (e.g., pixel driver circuits with a compensation function). In addition, by using a microcavity effect existing in the top-emitting device, a color gamut of an image that can be displayed by the display panel 01 may also be improved, thereby improving a display effect.

Herein, in the top-emitting device, the reflective electrode and the opposite electrode constitute a resonant cavity, and the light-emitting film is located in the resonant cavity. In a case where a length of the cavity is on a same order of magnitude as wavelengths of the light emitted by the light-emitting film, light with a specific wavelength may be intensified, so that a spectrum of the light emitted by the top-emitting device is narrowed. This effect is referred to as the microcavity effect.

In addition, since the light emitted by the light-emitting device D dose not exit from the first base 10, a light transmittance of the first base 10 in the light-emitting substrate 100 is not limited, and the first base 10 may be light-transmissive or opaque.

As can be seen from the foregoing description, the light-emitting layer 14 emits the light of the third color, that is, an entire light-emitting substrate 100 emits light of one color. A structure capable of converting the light of the third color into light of another color needs to be provided in the opposite substrate 200, so that the light-emitting substrate 100 and the opposite substrate 200 cooperate with each other to achieve a function of the display panel 01 to display a color image.

In the following embodiments, some exemplary structures of the opposite substrate 200 will be specifically described.

As shown in FIGS. 3A to 3D, the opposite substrate 200 includes a second base 20 and a plurality of structures disposed on a side of the second base 20 facing the light-emitting substrate 100.

The second base 20 may be a rigid base, and is made of, for example, glass. Alternatively, the second base 20 is a flexible base, and is made of, for example, PI, PET, PC, PMMA or PES.

Figure 5A:
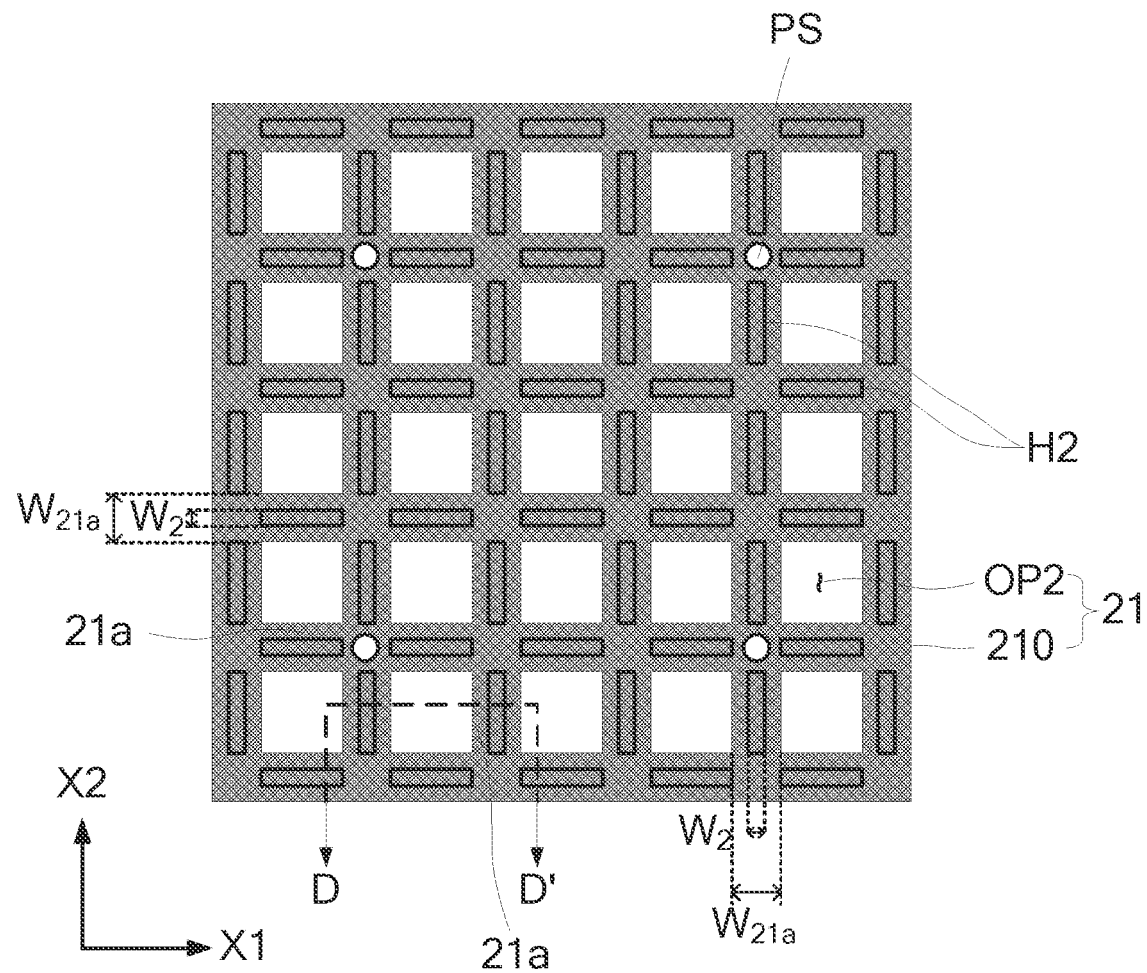
FIG. 5A is a diagram showing a structure of a barrier layer, in accordance with some embodiments.
Figure 5B:
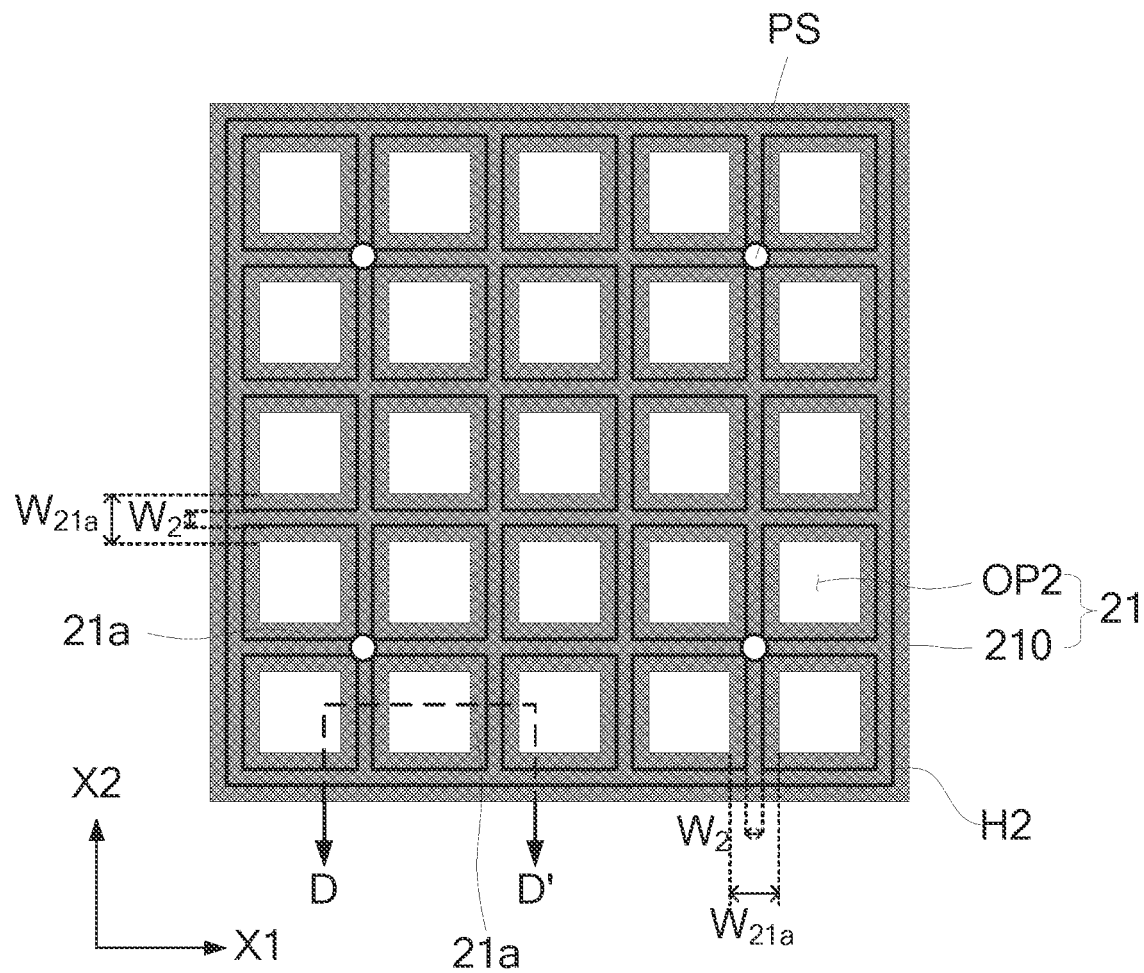
FIG. 5B is a diagram showing a structure of another barrier layer, in accordance with some embodiments.

FIGS. 5A to 5D are each a diagram showing a structure of a barrier layer 21 in the opposite substrate 200, in accordance with some embodiments, and a sectional direction in FIGS. 3A to 3D also corresponds to the D-D' direction in FIGS. 5A and 5B.

The plurality of structures include a barrier layer 21 and a plurality of light processing films 22a.

As shown in FIGS. 5A to 5D, the barrier layer 21 includes a plurality of second opening portions OP2 in one-to-one correspondence with the plurality of first opening portions OP1, and a barrier body 210 surrounding the plurality of second opening portions OP2. The barrier body 210 includes a plurality of banks 21a, and a bank 21a is provided between any two adjacent second opening portions OP2.

Each second opening portion OP2 is also in a corresponding sub-pixel region. It can be understood that, since the plurality of second opening portions OP2 are in one-to-one correspondence with the plurality of first opening portions OP1, shapes (i.e., shapes of cross sections parallel to a surface of the second base 20), the number, an arrangement and other setting manners of the second opening portions OP2 are the same as those of the first opening portions OP1 respectively, and details will not be repeated herein.

In some embodiments, as shown in FIGS. 3A and 3B, the plurality of light processing films 22a are in one-to-one correspondence with the plurality of first opening portions OP1, and are located in the plurality of second opening portions OP2 in one-to-one correspondence. The plurality of light processing films 22a include: a plurality of first quantum dot films 22a-1 configured to emit light of a first color upon excitation of the light of the third color, a plurality of second quantum dot films 22a-2 configured to emit light of a second color upon the excitation of the light of the third color, and a plurality of light-transmitting films 22a-3 configured to transmit the light of the third color.

Since the smaller a wavelength is, the greater photon energy is, light with a small wavelength is able to excite a corresponding quantum dot material to emit light with a large wavelength. That is to say, wavelengths of the light of the first color emitted by the first quantum dot films 22a-1 upon the excitation of the light of the third color are greater than wavelengths of the light of the third color. Similarly, wavelengths of the light of the second color emitted by the second quantum dot films 22a-2 upon the excitation of the light of the third color are greater than the wavelengths of the light of the third color, The first color, the second color, and the third color constitute three primary colors, so that the display panel 01 may display a color image. For example, the first color, the second color, and the third color are red, green, and blue, respectively. Correspondingly, the light of the first color, the light of the second color, and the light of the third color are red light, green light, and blue light, respectively.

Quantum dots in the first quantum dot films 22a-1 and the second quantum dot films 22a-2 may include, for example, any one of Group II-VI compound semiconductor nanocrystals, Group III-V compound semiconductor nanocrystals, Group IV-VI compound semiconductor nanocrystals, or mixtures thereof. Moreover, even in a case where the quantum dots in the first quantum dot films 22a-1 and the second quantum dot films 22a-2 are made of a same material, by adjusting sizes (generally particle sizes) of the quantum dots in the first quantum dot films 22a-1 and the second quantum dot films 22a-2, the first quantum dot films 22a-1 and the second quantum dot films 22a-2 may still emit the light of the first color (e.g., the red light) and the light of the second color (e.g., the green light) respectively upon the excitation of the light of the third color.

Quantum dots may be doped into a photoresist material, and by adjusting process conditions such as pre-baking, exposure, development and post-baking, a corresponding quantum dot film may be formed, and a thickness of the quantum dot film may be in a range of 10.0 µm to 12.0 µm, inclusive.

In some examples, the light-transmitting films 22a-3 are made of an organic material with a certain light transmittance. In some other examples, a material for forming the light-transmitting films 22a-3 includes an organic material with a certain light transmittance and scattering particles dispersed in the organic material in a certain proportion. The scattering particles are made of a scattering material that emits the light of the third color (e.g., the blue light) with a same color as light that it absorbs, which may be, for example, nanocrystals such as $ZrO_2$, $TiO_2$, ZnO or $BaSO_4$.

The light-transmitting films may each be formed by coating a photoresist (or a photoresist doped with scattering particles) and adjusting process conditions such as pre-baking, exposure, development, and post-baking. A thickness of the light-transmitting film is generally the same as the thickness of the quantum dot film, and may be in a range of 10.0 µm to 12.0 µm, inclusive.

Hereinafter, for convenience of description, a whole composed of the plurality of light processing films 22a is referred to as a filter layer 22. The overcoat 32 in the intermediate layer assembly may be formed on surfaces of the filter layer 22 and the barrier layer 21. That is, the overcoat 32 may be directly formed on surfaces of the filter layer 22 and the barrier layer 21 that are facing away from the second base 20.

Based on this, in some examples, in a case where a material for forming the overcoat 32 includes the organic material with the certain viscosity and light transmittance and the scattering particles dispersed in the organic material in the certain proportion, and the material for forming the light-transmitting films 22a-3 includes the organic material with the certain light transmittance and the scattering particles dispersed in the organic material in the certain proportion, the light-transmitting films 22a-3 may be connected to the overcoat 32 to form an integral structure.

Considering an example in which the light of the third color emitted by the light-emitting layer 14 in the light-emitting substrate 100 is the blue light, the display panel 01 shown in FIGS. 3A and 3B may display a color image by combining blue OLEDs (BOLEDs) and quantum dots (QDs). Thus, a structure of the display panel 01 may also be referred to as "BOLED+QD".

In some other embodiments, based on the structures shown in FIGS. 3A and 3B, in the opposite substrate 200, the plurality of structures disposed on the side of the second base 20 facing the light-emitting substrate 100 further include a light-shielding layer and a plurality of auxiliary light processing films.

As shown in FIGS. 3C and 3D, a light-shielding layer 23 is provided on a side of the barrier layer 21 facing the second base 20.

The light-shielding layer 23 may be substantially opaque, and is made of, for example, a light-shielding material for absorbing light. The light-shielding material includes carbon black, titanium oxynitride, titanium black, phenylene black, aniline black, cyanine black, or black resin.

For example, the light-shielding layer 23 is a black matrix (BM) layer. A layer of photosensitive BM material with a thickness of 1.0 µm may be formed on a surface of the second base 20 facing the light-emitting substrate 100 through a spin coating process, and the light-shielding layer 23 may be formed by adjusting process conditions such as pre-baking, exposure, development and post-baking.

As shown in FIGS. 3C and 3D, a plurality of auxiliary light processing films 24a are provided in opening portions of the light-shielding layer 23 in one-to-one correspondence.

In some examples, the plurality of auxiliary light processing films 24a include: a plurality of first color filter films 24a-1 in one-to-one correspondence with the plurality of first quantum dot films 22a-1, a plurality of second color filter films 24a-2 in one-to-one correspondence with the plurality of second quantum dot films 22a-2, and a plurality of third color filter films 24a-3 in one-to-one correspondence with the plurality of light-transmitting films 22a-3.

Each first color filter film 24a-1 is disposed on a side of a corresponding first quantum dot film 22a-1 facing the second base 20. The first color filter films 24a-1 are able to uniformly transmit the light of the first color, and to absorb a part of light of the third color entering the first color filter films 24a-1 that fails to effectively excite quantum dots to emit light, so as to avoid light mixing.

The first color filter film 24a-1 has a first color (e.g., red), and may be made of, for example, a red photoresist.

Each second color filter film 24a-2 is disposed on a side of a corresponding second quantum dot film 22a-2 facing the second base 20. The second color filter films 24a-2 are able to uniformly transmit the light of the second color, and to absorb a part of light of the third color entering the second color filter films 24a-2 that fails to effectively excite quantum dots to emit light, so as to avoid light mixing.

The second color filter film 24a-2 has a second color (e.g., green), and may be made of, for example, a green photoresist.

Each third color filter film 24a-3 is disposed on a side of a corresponding light-transmitting film 22a-3 facing the second base 20. The third color filter films 24a-3 are able to uniformly transmit the light of the third color.

The third color filter film 24a-3 has a third color (e.g., blue), and may be made of, for example, a blue photoresist.

Each type of color filter film may be formed by coating a photoresist of a corresponding color and adjusting process conditions such as pre-baking, exposure, development and post-baking, and a thickness thereof may be 1.0 μm.

As shown in FIGS. 3C and 3D, in some other examples, the plurality of auxiliary light processing films 24a include: a plurality of first color filter films 24a-1 in one-to-one correspondence with the plurality of first quantum dot films 22a-1, a plurality of second color filter films 24a-2 in one-to-one correspondence with the plurality of second quantum dot films 22a-2, and a plurality of auxiliary light-transmitting films 24a-3' in one-to-one correspondence with the plurality of light-transmitting films 22a-3.

For description of the first color filter films 24a-1 and the second color filter films 24a-2, reference may be made to the foregoing examples, and details will not be repeated herein.

Each auxiliary light-transmitting film 24a-3" is disposed on a side of a corresponding light-transmitting film 22a-3 facing the second base 20. The auxiliary light-transmitting films 24a-3' are able to uniformly transmit the light of the third color.

In some examples, the auxiliary light-transmitting films 24a-3' are made of an organic material with a certain light transmittance. In some other examples, the material for forming the auxiliary light-transmitting films 24a-3' includes an organic material with a certain light transmittance and scattering particles dispersed in the organic material in a certain proportion. The scattering particles are made of a scattering material that emits the light of the third color (e.g., the blue light) with the same color as the light that it absorbs, which may be, for example, nanocrystals such as $ZrO_2$, $TiO_2$, ZnO or $BaSO_4$.

Moreover, the auxiliary light-transmitting films 24a-3' and the light-transmitting films 22a-3 may be connected to the overcoat 32 to form an integral structure.

For specific description of the structures shown in FIGS. 3C and 3D with same reference signs as those in FIGS. 3A and 38, reference may be made to the foregoing examples, and details will not be repeated herein.

Considering the example in which the light of the third color emitted by the light-emitting layer 14 in the light-emitting substrate 100 is the blue light, the display panel 01 shown in FIGS. 3C and 3D may display a color image by combining blue OLEDs (BOLEDs), quantum dots (ODs) and color films (CFs). Thus, a structure of the display panel 01 may also be referred to as "BOLED+QD+CF".

In some examples, as shown in FIGS. 5A to 5D, the barrier body 210 is reflective, so that in light scattered by the quantum dots or scattering particles, a part of light reaching the barrier body 210 may be directed to the second base 20 and then exit. As a result, a utilization rate of the light emitted by the light-emitting layer 14 may be improved.

A material of the reflective barrier body 210 (hereinafter referred to as a reflective barrier material) includes a light-shielding material and scattering particles dispersed in the light-shielding material. The light-shielding material includes carbon black, titanium oxynitride, titanium black, phenylene black, aniline black, cyanine black, or black resin. The scattering particles may be, for example, nanocrystalline particles such as $ZrO_2$, $TiO_2$, ZnO or $BaSO_4$. By adjusting a dispersion ratio of the scattering particles in the light-shielding material, a degree of reflection of light by the reflective barrier body 210 may be controlled.

Figure 3E:
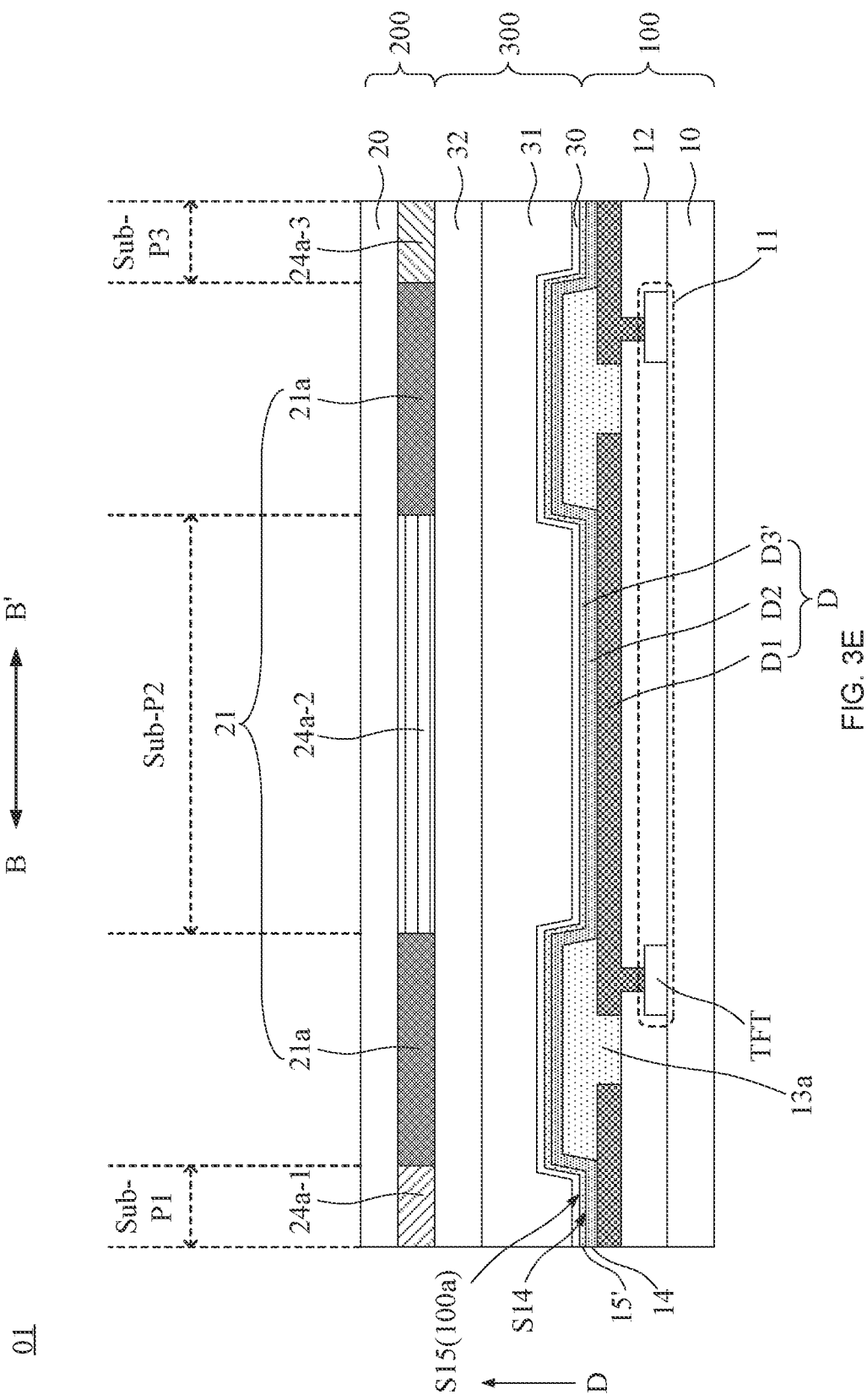
FIG. 3E is yet another sectional view taken along the section line B-B' in FIG. 2.

FIG. 3E is yet another sectional view taken along the section line B-B' in FIG. 2. In yet some other embodiments, as shown in FIG. 3E, in the light-emitting substrate 100, the light-emitting layer 14 emits white light, and may be formed by, for example, stacking a light-emitting sub-layer emitting the red light, a light-emitting sub-layer emitting the green light, and a light-emitting sub-layer emitting the blue light.

In the display panel 01 shown in FIG. 3E, an electrode layer covering the surface S14 of the light-emitting layer 14 facing away from the pixel defining layer 13 is a transmissive electrode layer 15'. That is to say, an electrode opposite to the reflective electrode D1 in each light-emitting device D is a transmissive electrode D3', and is, for example, a layer of indium zinc oxide (IZO) with a thickness of 0.3 μm (3000 Å).

In the opposite substrate 200, the plurality of structures include the barrier layer 21, and the first color filter films 24a-1, the second color filter films 24a-2, and the third color filter films 24a-3 that are disposed in the plurality of second opening portions OP2, so as to respectively transmit the light of the first color, the light of the second color, and the light of the third color.

For example, the barrier layer 21 may be a BM layer.

Figure 5C:
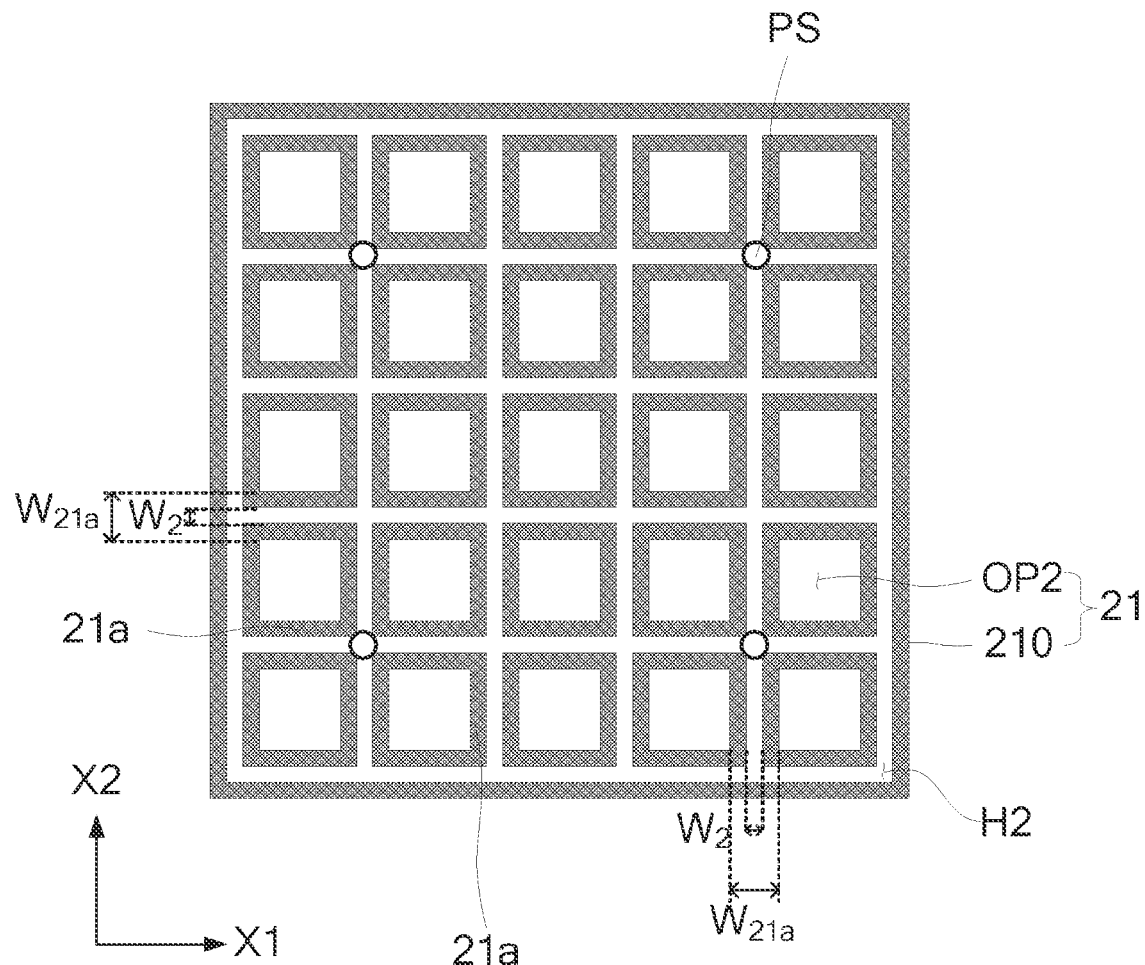
FIG. 5C is a diagram showing a structure of yet another barrier layer, in accordance with some embodiments.
Figure 5D:
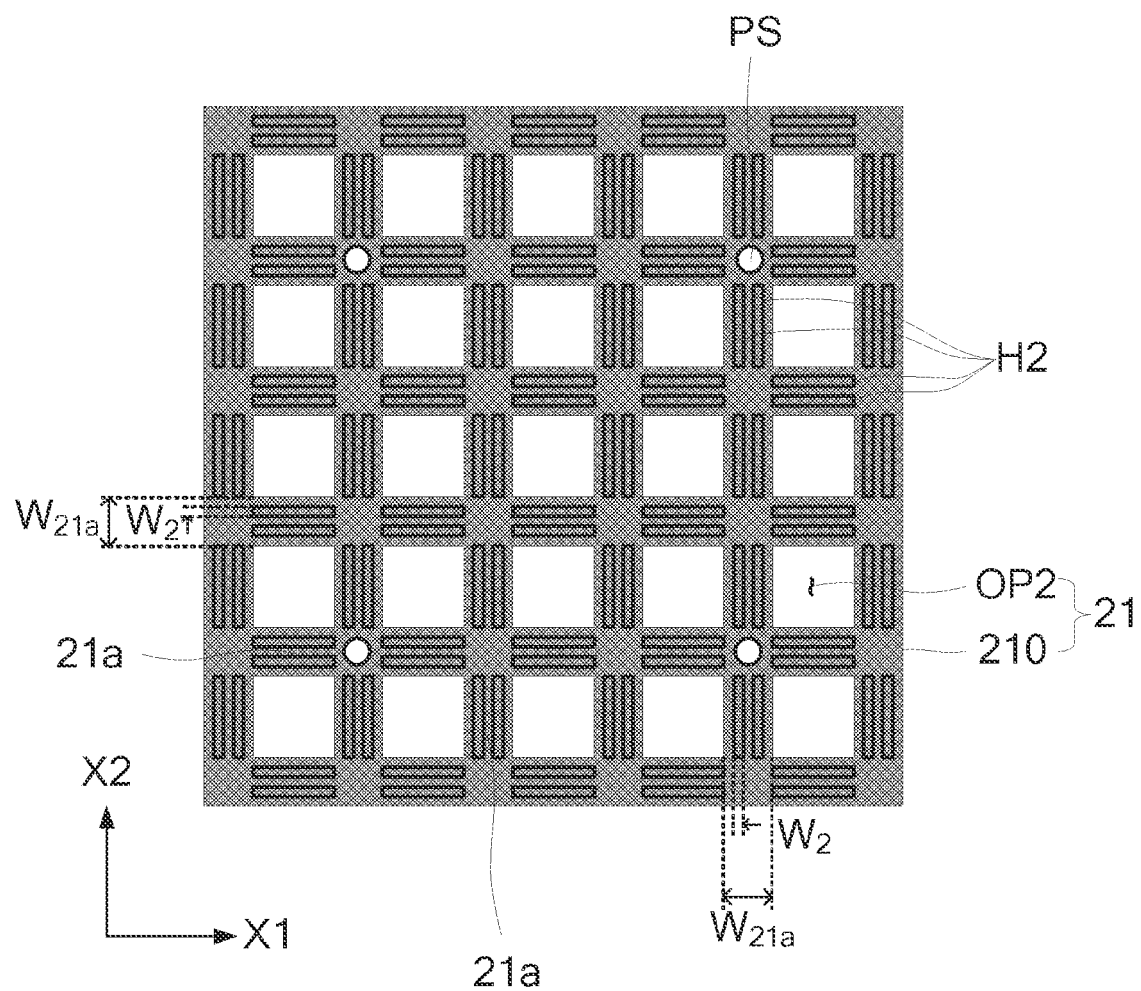
FIG. 5D is a diagram showing a structure of yet another barrier layer, in accordance with some embodiments.
Figure 5E:
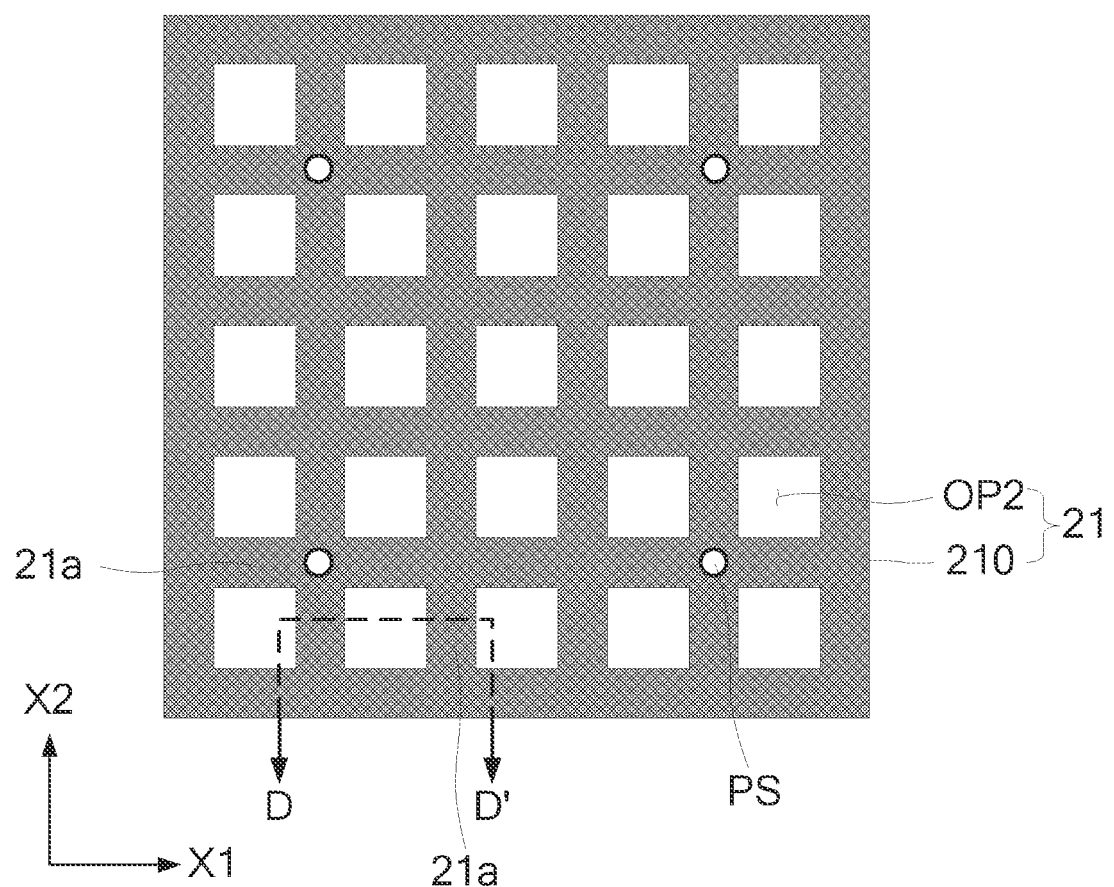
FIG. 5E is a diagram showing a structure of yet another barrier layer, in accordance with some embodiments.

FIG. 5E is a diagram showing a structure of the barrier layer 21 in the opposite substrate 200, in accordance with some embodiments, and a sectional direction in FIG. 3E also corresponds to the D-D' direction in FIG. 5E. For specific description of the structures shown in FIG. 3E with same reference signs as those shown in FIGS. 3A to 3D, and the structures shown in FIG. 5E with same reference signs as those shown in FIGS. 5A to 5D, reference may be made to the foregoing embodiments, and details will not be repeated herein.

Since the light of the third color emitted by the light-emitting layer 14 in the light-emitting substrate 100 is the white light, the display panel 01 shown in FIG. 3E may display a color image by combining white OLEDs (WOLEDs) and color films (CFs). Thus, a structure of the display panel 01 may also be referred to as "WOLED+CF".

FIGS. 5A to 5E each further show a plurality of post spacers PS arranged at intervals on a side of the barrier layer 21 facing the light-emitting substrate 100. A thickness of the post spacers PS in the pointing direction D may be the same as the thickness of the filler layer 31, and may be, for example, in a range of 5.0 μm to 6 μm, inclusive.

It can be understood that, the post spacers PS are in direct contact with the overcoat 32, and are not in contact with the barrier layer 21. FIGS. 5A to 5E show a possible arrangement of the post spacers PS only by virtue of a top view of the barrier layer 21. That is, in the row direction X1, a plurality of columns of second opening portions OP2 may be arranged at intervals between two adjacent post spacers PS; in the column direction X2, a plurality of rows of second opening portions OP2 may be arranged at intervals between two adjacent post spacers PS.

An optical path in the display panel 01 will be described in detail below by virtue of the specific structures of the light-emitting substrate 100 and the opposite substrate 200 provided by the plurality of embodiments described above.

Figure 6:
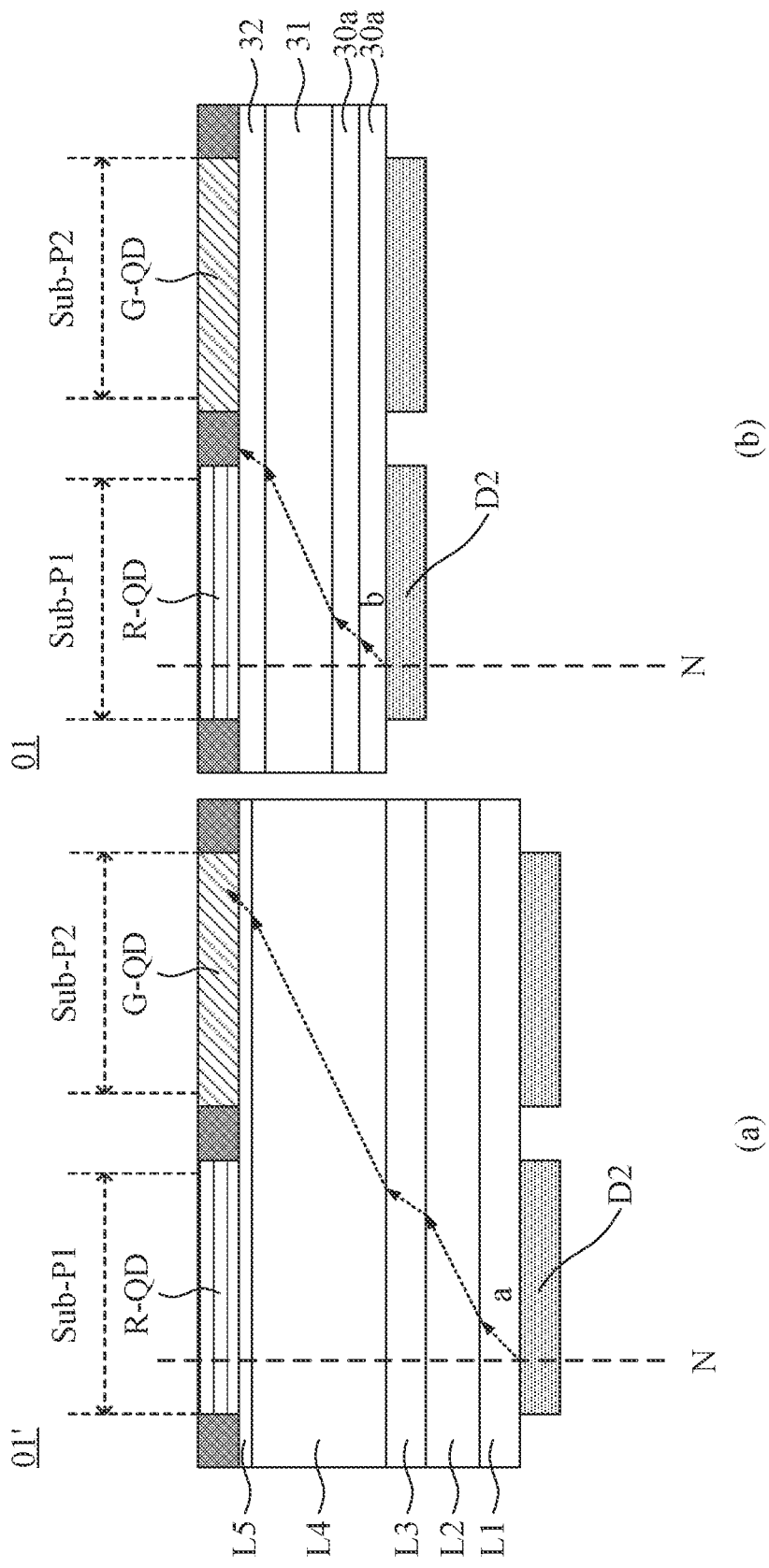
FIG. 6 is a diagram showing comparison between an optical path in a display panel, in accordance with some embodiments and an optical path in a display panel, in accordance with the related art.

FIG. 6 is a diagram showing a comparison between the optical path in the display panel 01, in accordance with some embodiments and an optical path in a display panel 01', in accordance with the related art.

In the display panel 01' provided by the related art shown in (a) of FIG. 6, light, inclined with respect to the normal line N, emitted by a light-emitting film D2 of a light-emitting device D in a sub-pixel region Sub-P1 (indicated by the dashed arrows a in FIG. 6) sequentially passes through a thin film encapsulation layer with a thickness of 10.0 μm, a filler layer L4 with a thickness of 10.0 μm, and a silicon oxynitride layer L5 with a thickness of 1.0 μm.

The thin film encapsulation layer includes a first sub-layer L1 (made of SiON, and with a refractive index of 1.8), a second sub-layer (made of an organic material, and with a refractive index of 1.5), and a third sub-layer L3 (made of SiN$_y$, and with a refractive index of 1.9) that are sequentially stacked. A refractive index of the filler layer L4 is 1.5, and a refractive index of the silicon oxynitride layer L5 is 1.8.

After the inclined light sequentially passes through the above layers, light at some angles does not enter a quantum dot film (e.g., a red quantum dot film R-QD) in the sub-pixel region Sub-P1, but enters a quantum dot film (e.g., a green quantum dot film G-QD) in an adjacent sub-pixel region Sub-P2, thereby causing cross-color of light emitted by the sub-pixel region Sub-P2.

Considering an example in which the light-emitting device D emits blue light, energy of light emitted by the light-emitting device D that enters a corresponding sub-pixel region and energy of light emitted by the light-emitting device D that enters an adjacent sub-pixel region after the light emitted by the light-emitting device D passes through the layers are simulated by using Lighttools software, and ratios of the energies in these sub-pixel regions to total energy of the blue light that the light-emitting device D is able to emit are separately calculated, and then the following Tables 1.1 to 1.3 may be obtained.

TABLE 1.1

|  | B | Only R turned on | B |
|---|---|---|---|
| Energy | 0.5169 | 29.2949 | 0.5586 |
| Ratio of energy | 0.52% | 29.29% | 0.56% |

TABLE 1.2

|  | B | Only G turned on | B |
|---|---|---|---|
| Energy | 0.5169 | 29.2942 | 0.5586 |
| Ratio of energy | 0.52% | 29.29% | 0.56% |

TABLE 1.3

|  | R | Only B turned on | G |
|---|---|---|---|
| Energy | 1.3208 | 22.7840 | 1.3208 |
| Ratio of energy | 1.32% | 22.78% | 1.32% |

Based on the Tables 1.1 to 1.3, according to excitation characteristics of quantum dots and transmission spectra of color films, it may be possible to calculate a result of influence of cross-color between adjacent sub-pixel regions on color coordinates of a monochromatic image, which is shown in Table 2.

TABLE 2

|  | R-x | R-y | G-x | G-y | B-x | B-y | Color gamut |
|---|---|---|---|---|---|---|---|
| Theoretical coordinate value without consideration of cross-color | 0.68711 | 0.30551 | 0.25805 | 0.69488 | 0.13678 | 0.045233 | 103% @ NTSC |
| Simulated coordinate value with consideration of cross-color | 0.48491 | 0.20988 | 0.2142 | 0.45995 | 0.13925 | 0.048616 | 41% @ NTSC |
| Difference | 0.2022 | 0.09563 | 0.04385 | 0.23493 | 0.00247 | 0.00338 |  |

In the display panel 01 provided by the embodiments of the present disclosure shown in (b) of FIG. 6, light, inclined with respect to the normal line N, emitted by a light-emitting film D2 of a light-emitting device D in the sub-pixel region Sub-P1 (indicated by the dashed arrows b in FIG. 6) sequentially passes through the thin film encapsulation layer with a thickness of 2.0 μm, the filler layer 31 with a thickness in a range of 5.0 μm to 6.0 μm, inclusive, and the overcoat 32 with the thickness of 2.0 μm.

The thin film encapsulation layer includes a first encapsulation sub-layer 30a (made of SiON, and with a refractive index of 1.8) and a second encapsulation sub-layer 30a (made of SiN$_y$, and with a refractive index of 1.9) that are sequentially stacked. The refractive index of the filler layer 31 is 1.5, and the refractive index of the overcoat 32 is 1.7.

After the inclined light sequentially passes through the above layers, a combination of the refractive indexes and thicknesses of the above layers may make light at some angles emitted by the light-emitting device D not enter a quantum dot film (e.g., a green quantum dot film G-QD) in the adjacent sub-pixel region Sub-P2, and may reduce a degree of cross-color of light emitted by the sub-pixel region Sub-P2.

Considering an example in which the light-emitting device D emits the blue light, energy of light emitted by the light-emitting device D that enters a corresponding sub-pixel region and energy of light emitted by the light-emitting device D that enters an adjacent sub-pixel region after the light emitted by the light-emitting device D passes through the layers are simulated by using the Lighttools software, and ratios of the energies in these sub-pixel regions to total energy of the blue light that the light-emitting device D is able to emit are separately calculated, and then the following Tables 3.1 to 3.3 may be obtained.

TABLE 3.1

|  | B | Only R turned on | B |
|---|---|---|---|
| Energy | 0.1085 | 36.7307 | 0.1139 |
| Ratio of energy | 0.11% | 36.73% | 0.11% |

TABLE 3.2

|  | B | Only G turned on | B |
|---|---|---|---|
| Energy | 0.1085 | 36.7307 | 0.1139 |
| Ratio of energy | 0.11% | 36.73% | 0.11% |

TABLE 3.3

|  | R | Only B turned on | G |
|---|---|---|---|
| Energy | 0.2670 | 30.724 | 0.2670 |
| Ratio of energy | 0.27% | 30.72% | 0.27% |

Based on the Tables 3.1 to 3.3, according to excitation characteristics of the quantum dots and transmission spectra of the color films, it may be possible to calculate a result of influence of cross-color between adjacent sub-pixel regions on color coordinates of a monochromatic image, which is shown in Table 4.

TABLE 4

|  | R-x | R-y | G-x | G-y | B-x | B-y | Color gamut |
|---|---|---|---|---|---|---|---|
| Theoretical coordinate value without consideration of cross-color | 0.68711 | 0.30551 | 0.25805 | 0.69488 | 0.13678 | 0.045233 | 103% @ NTSC |
| Simulated coordinate value with consideration of cross-color | 0.63921 | 0.28286 | 0.24774 | 0.63691 | 0.13716 | 0.045744 | 86% @ NTSC |
| Difference | 0.0479 | 0.02265 | 0.01031 | 0.05527 | 0.00038 | 0.00051 | |

In the Tables 1.1 to 3.3, "R", "G" and "B" respectively represent a red sub-pixel region, a green sub-pixel region, and a blue sub-pixel region. The energy refers to radiance, a unit of which is $W/(sr \cdot m^2)$, i.e., watts/(steradian×square meter).

An arrangement of the sub-pixel regions simulated by using the Lighttools software is R, B, G and B.

In the Tables 1.1 and 3.1, "only R turned on" means that only a light-emitting device corresponding to the red sub-pixel region emits light; data on a left side of a data column indicated by "only R turned on" are energy of a portion of the light emitted by the light-emitting device in the red sub-pixel region that reaches an adjacent blue sub-pixel region and a ratio of the energy; data on a right side of the data column indicated by "only R turned on" are energy of a portion of the light emitted by the light-emitting device in the red sub-pixel region that reaches another adjacent blue sub-pixel region and a ratio of the energy.

By comparing data in corresponding columns in the Tables 1.1 and 3.1, it can be seen that, by virtue of the combination of the refractive indexes and thicknesses of the layers in the intermediate layer assembly 200 provided by the embodiments of the present disclosure, energy of the light emitted by the light-emitting device in the red sub-pixel region after passing through the layers may be increased, that is, light-exit efficiency of the red sub-pixel region may be improved; energy of a portion of the light emitted by the light-emitting device that reaches the adjacent blue sub-pixel regions may be reduced, that is, crosstalk in the adjacent sub-pixel regions may be reduced.

Similarly, in the Tables 1.2 and 3.2, "only G turned on" means that only a light-emitting device corresponding to the green sub-pixel region emits light; data on a left side of a data column indicated by "only G turned on" are energy of a portion, of the light emitted by the light-emitting device in the green sub-pixel region that reaches an adjacent blue sub-pixel region and a ratio of the energy; data on a right side of the data column indicated by "only G turned on" are energy of a portion of the light emitted by the light-emitting device in the green sub-pixel region that reaches another adjacent blue sub-pixel region and a ratio of the energy.

By comparing data in corresponding columns in the Tables 12 and 3.2, it can be seen that, by virtue of the combination of the refractive indexes and thicknesses of the layers in the intermediate layer assembly 200 provided by the embodiments of the present disclosure, energy of the light emitted by the light-emitting device in the green sub-pixel region after passing through the layers may be increased, that is, light-exit efficiency of the green sub-pixel region may be improved; energy of a portion of the light emitted by the light-emitting device that reaches the adjacent blue sub-pixel regions may be reduced, that is, crosstalk in the adjacent sub-pixel regions may be reduced.

Similarly, "only B turned on" means that only a light-emitting device corresponding to the blue sub-pixel region emits light; data on a left side of a data column indicated by "only B turned on" are energy of a portion of the light emitted by the light-emitting device in the blue sub-pixel region that reaches an adjacent red sub-pixel region and a ratio of the energy; data on a right side of the data column indicated by "only B turned on" are energy of a portion of the light emitted by the light-emitting device in the blue sub-pixel region that reaches another adjacent green sub-pixel region and a ratio of the energy.

By comparing data in corresponding columns in the Tables 1.3 and 3.3, it can be seen that, by virtue of the combination of the refractive indexes and thicknesses of the layers in the intermediate layer assembly 200 provided by the embodiments of the present disclosure, energy of the light emitted by the light-emitting device in the blue sub-pixel region after passing through the layers may be increased, that is, light-exit efficiency of the blue sub-pixel region may be improved; energy of a portion of the light emitted by the light-emitting device that reaches the adjacent red and green sub-pixel regions may be reduced, that is, crosstalk in the adjacent sub-pixel regions may be reduced.

In the Tables 2 and 4, "R-x" and "R-y" respectively represent red color coordinates x and y, "G-x" and "G-y" respectively represent green color coordinates x and y, and "B-x" and "B y" respectively represent blue color coordinates x and y. NTSC color gamut refers to a sum of colors under a standard specified by the National Television Standards Committee.

As can be seen from the comparisons between the above tables, in the display panel 01 provided by the embodiments of the present disclosure, by reasonably optimizing relationships between the refractive indexes of and the thicknesses of the layers in the intermediate layer assembly 200, the color gamut of the image displayed by the display panel 01 may be increased from 41% in the related art to 86%, and in turn, the display quality may be significantly improved.

Figure 7:
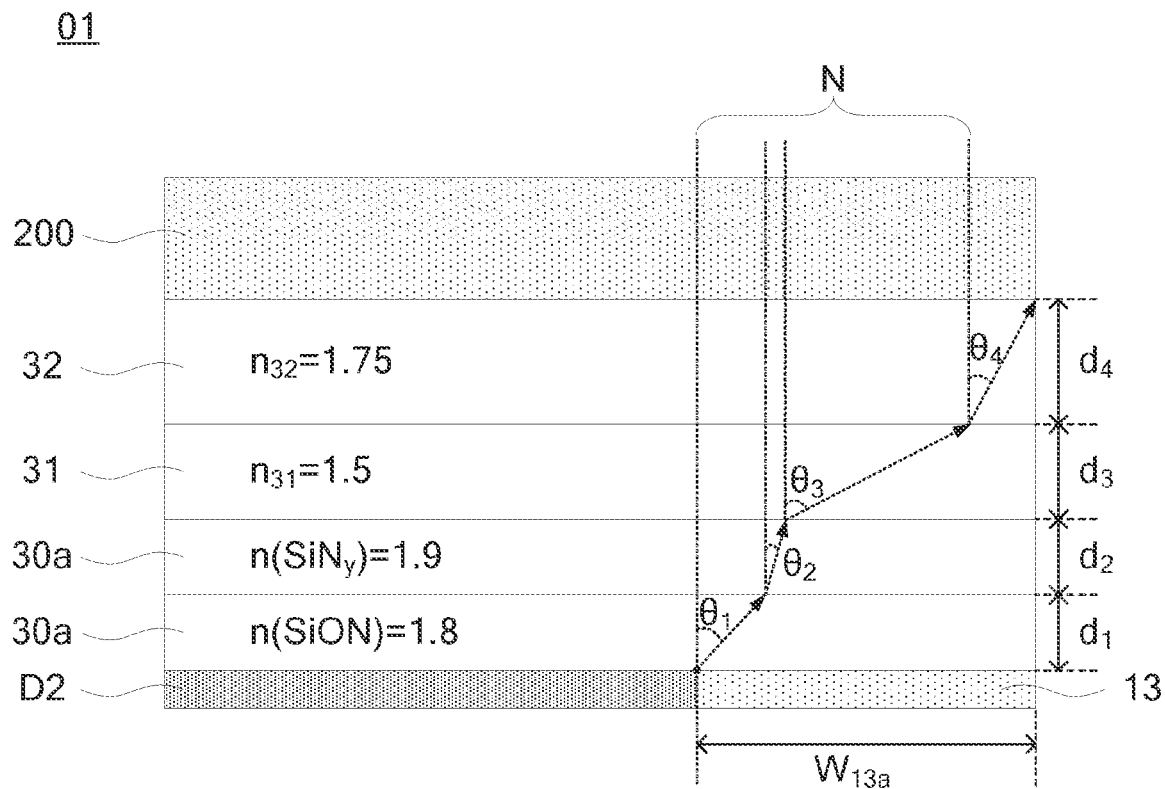
FIG. 7 is a diagram showing an optical path in a display panel, in accordance with some embodiments.

FIG. 7 is a diagram showing an optical path in the display panel 01, in accordance with some embodiments. As shown in FIG. 7, in the pointing direction D, the intermediate layer assembly 300 includes the first encapsulation sub-layer 30a (made of SiON, and with the refractive index of 1.8), the second encapsulation sub-layer 30a (made of $SiN_y$, and with the refractive index of 1.9), the filler layer 31 (with the refractive index of 1.5), and the overcoat 32 (with the refractive index of 1.75). The thicknesses of these layers are sequentially $d_1$, $d_2$, $d_3$ and $d_4$. A refractive index of the light-emitting film D2 in the light-emitting device D is 1.5.

With respect to the normal line N, an angle of light emitted by a light-emitting film D2 in a light-emitting device D is in a range of 0° to 90°, inclusive, an angle of light exiting vertically is 0°, and an angle of light exiting laterally is 90°. A refraction angle of light emitted by the light-emitting device D that enters the first encapsulation sub-layer 30a, a refraction angle of light entering the second encapsulation sub-layer 30a, a refraction angle of light entering the filler layer 31, and a refraction angle of light entering the overcoat 32 are sequentially $\theta_1$, $\theta_2$, $\theta_3$ and $\theta_4$. It can be seen from the formula of the relative refractive index that, $$n(SiON) \times \sin\theta_1 = n(SiN_y) \times \sin\theta_2 = n_{31} \times \sin\theta_3 = n_{32} \times \sin\theta_4.$$

A width of a pixel defining portion 13a in the pixel defining layer 13 (i.e., a dimension in a direction perpendicular to an extension direction thereof) $W_{13a}$ may be obtained through the following equation:

$$W_{13a} = d_1 \times \tan\theta_1 + d_2 \times \tan\theta_2 + d_3 \times \tan\theta_3 + d_4 \times \tan\theta_4.$$

The refractive index of the first encapsulation sub-layer 30a and the refractive index of the filler layer 31 are both lower than the refractive index of the second encapsulation sub-layer 30a, the refractive index of the filler layer 31 is lower than the refractive index of the overcoat 32, and light convergence or light divergence may occur between different interfaces. When the light emitted by the light-emitting film D2 in the light-emitting device D laterally enters a right adjacent sub-pixel region from a rightmost side, a maximum exit angle of $\theta_1$ (i.e., a maximum angle at which the light can exit from the light-emitting film D2) is approximately 56°, a maximum exit angle of $\theta_2$ (i.e., a maximum angle at which the light entering the first encapsulation sub-layer 30a can exit) is approximately 52°, a maximum exit angle of $\theta_3$ (i.e., a maximum angle at which the light entering the second encapsulation sub-layer 30a can exit) is approximately 90°, and a maximum exit angle of $\theta_4$ (i.e., a maximum angle at which the light entering the filler layer 31 can exit) is approximately 59°.

For example, in a case where the refractive index of the filler layer 31 is increased to 1.7 by selecting an appropriate material, the maximum exit angle of $\theta_3$ is approximately 62°, which facilitates to prevent the cross-color.

Obviously, in order to optimize the width $W_{13a}$ of the pixel defining portion 13a as much as possible, in the intermediate layer assembly 300, the larger a maximum exit angle of a layer is, the smaller a thickness thereof is; conversely, the smaller a maximum exit angle of a layer is, the larger a thickness thereof is.

Based on the above, as shown in FIGS. 3A to 3D, the blue light emitted by the light-emitting layer 14 is scattered upon reaching the quantum dots or scattering particles in the light processing films 22a in the opposite substrate 200, and some light irradiates downward above the pixel defining portions 13a. Since the electrode layer 15 also extends over the pixel defining portions 13a, in order to reduce a total amount of light scattered from a light processing film 22a that is reflected by the electrode layer 15 and then directed to an adjacent light processing film 22a, as shown in FIGS. 4A to 4D, at least one first hole H1 is provided in a surface S13a (shown in FIGS. 3A to 3D), facing the opposite substrate 200, of each of at least one pixel defining portion 13a.

Herein, the first hole H1 refers to a portion, recessed toward the first base 10, in the surface S13a, facing the opposite substrate 200, of the pixel defining portion 13a provided with the first hole H1.

It can be understood that, since thicknesses of the light-emitting layer 14 and the electrode layer 15 are generally very small compared with a thickness of the pixel defining layer 13, portions of the light-emitting layer 14 and the electrode layer 15 that extend into the first hole H1 do not fill the first hole H1. That is to say, a portion of the electrode layer 15 in the first hole H1 also forms a recess.

In the related art, a surface of a pixel defining layer is flat or upwardly convex. Correspondingly, portions of the light-emitting layer and the electrode layer on the surface of the pixel defining layer are also flat or upwardly convex. Light reflected by quantum dots that enters between the pixel defining layer and the barrier body is reflected back and forth to a small extent. As a result, energy of light directed into adjacent sub-pixel regions is large, and a degree of crosstalk of light emitted from the adjacent sub-pixel regions is large.

Figure 8:
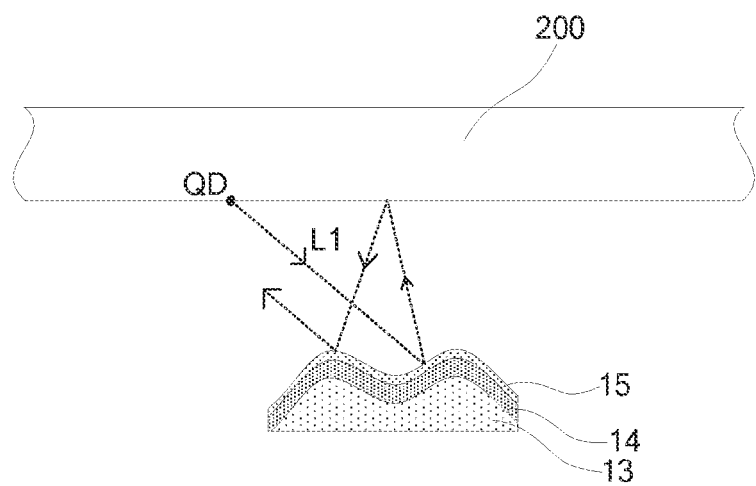
FIG. 8 is a diagram showing an optical path caused by a pixel defining layer, in accordance with some embodiments.

FIG. 8 is a diagram showing an optical path caused by the pixel defining layer 13, in accordance with some embodiments.

As shown in FIG. 8, in the display panel 01 provided by the embodiments of the present disclosure, the light emitted by the light-emitting layer 14 is scattered upon reaching surfaces of the QDs in the opposite substrate 200. Since the electrode layer 15 made of the transflective material or the partially transflective material and the reflective barrier body 210 have a reflection effect on light, and the first hole H1 is recessed downward, the light may be reflected at a small angle in the first hole H1. As a result, light L1 at some angles may be directed to a region where the quantum dots are located after being reflected between the pixel defining layer 13 and the barrier body. Moreover, due to presence of the first hole H1, a surface of the pixel defining layer 13 is uneven, so that more reflection paths may be provided, that is, a probability that the light is reflected may be increased. Thus, some light is reflected back and forth between the pixel defining layer 13 and the barrier layer 21. Consequently, energy of the light may be consumed, energy of light directed to adjacent sub-pixel regions may be reduced, and in turn, crosstalk of light emitted from the adjacent sub-pixel regions may be reduced.

In some examples, a layer of pixel defining layer material with a thickness in a range of 0.5 μm to 2.0 μm inclusive may be formed on the planarization layer 12 through a spin coating process, and a pixel defining layer material in a partial region may be removed through a corresponding manufacturing process to form the opening portions OP1 and the first holes H1 and then form the pixel defining layer 13.

For example, the pixel defining layer material is photoresist, by adjusting process conditions such as pre-baking, exposure, development, post-baking and aching, the first opening portions OP1 and the first holes H1 may be formed, and a shape of the surface of the pixel defining body 130 facing the opposite substrate 200 may also be adjusted.

For another example, the pixel definition layer material is resin, through a nanoimprinting process, the first opening portions OP1 and the first holes H1 may be formed and the shape of the surface 5130 of the pixel defining body 130 facing the opposite substrate 200 may also be adjusted.

In the pointing direction D, a dimension (i.e., a depth) of the first holes H1 may be 60% to 100% of the thickness of the coated layer of pixel defining layer material.

Figure 4C:
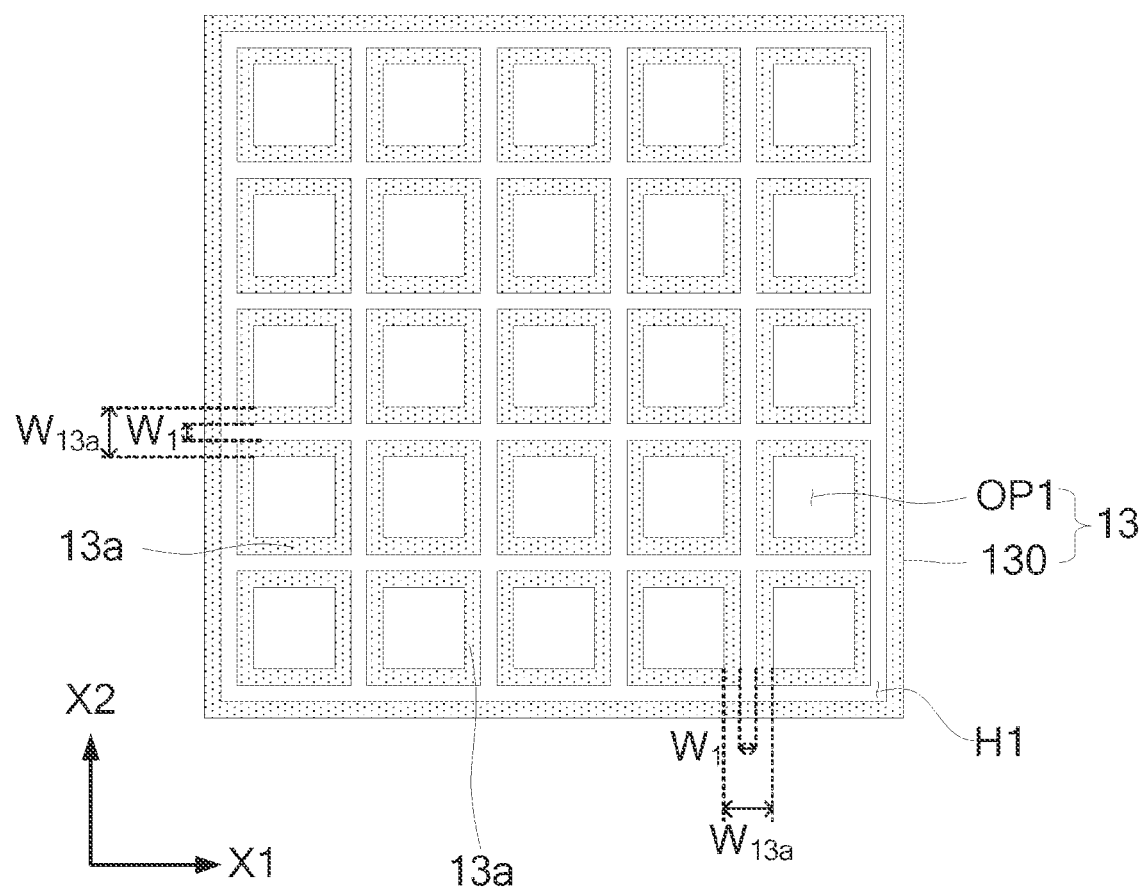
FIG. 4C is a diagram showing a structure of yet another pixel defining layer, in accordance with some embodiments.
Figure 4D:
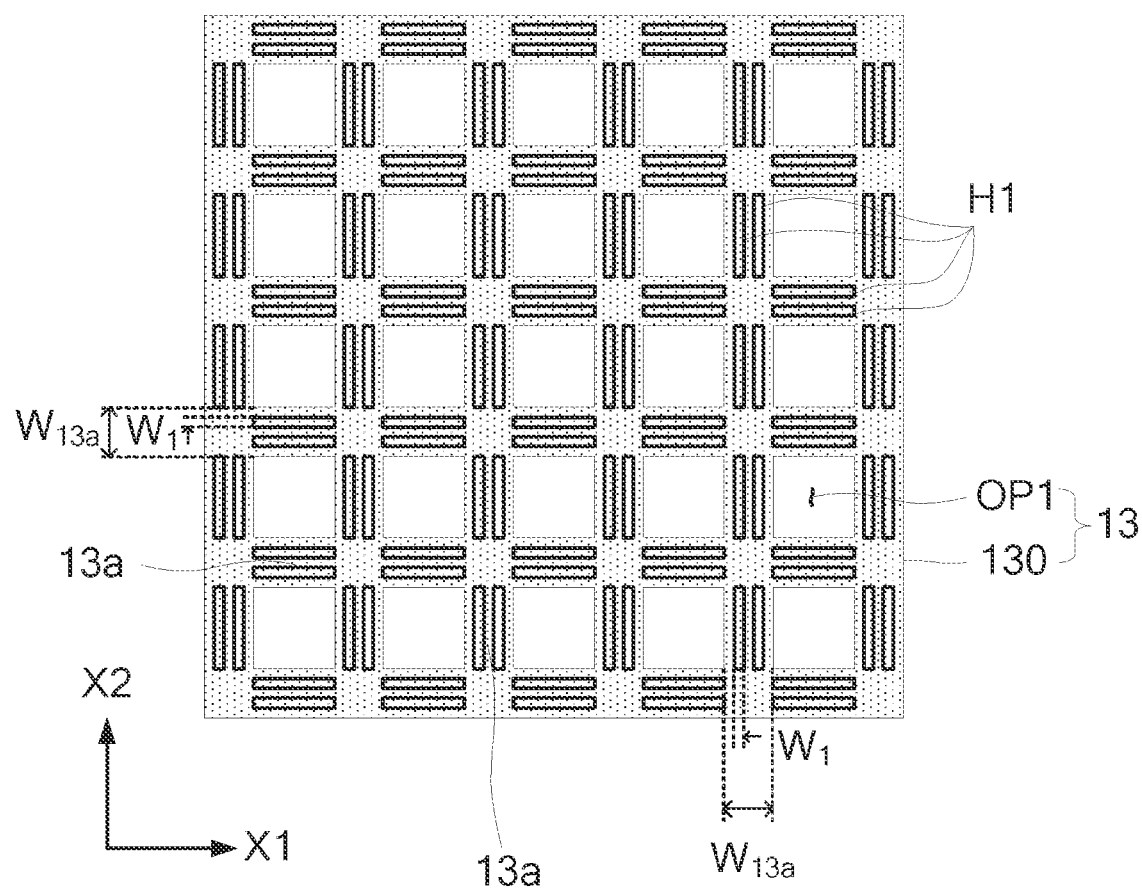
FIG. 4D is a diagram showing a structure of yet another pixel defining layer, in accordance with some embodiments.

That is to say, in some examples, as shown in FIGS. 4A, 4B and 4D, a first hole H1 does not penetrate a corresponding pixel defining portion 13a. In this case, the first hole H1 is a groove (also referred to as a blind hole). In some other examples, as shown in FIG. 4C, a first hole H1 penetrates a corresponding pixel defining portion 13a. In this case, the first hole H1 is a through hole (i.e., an opening smaller than the first opening portion OP1).

Figure 9A:
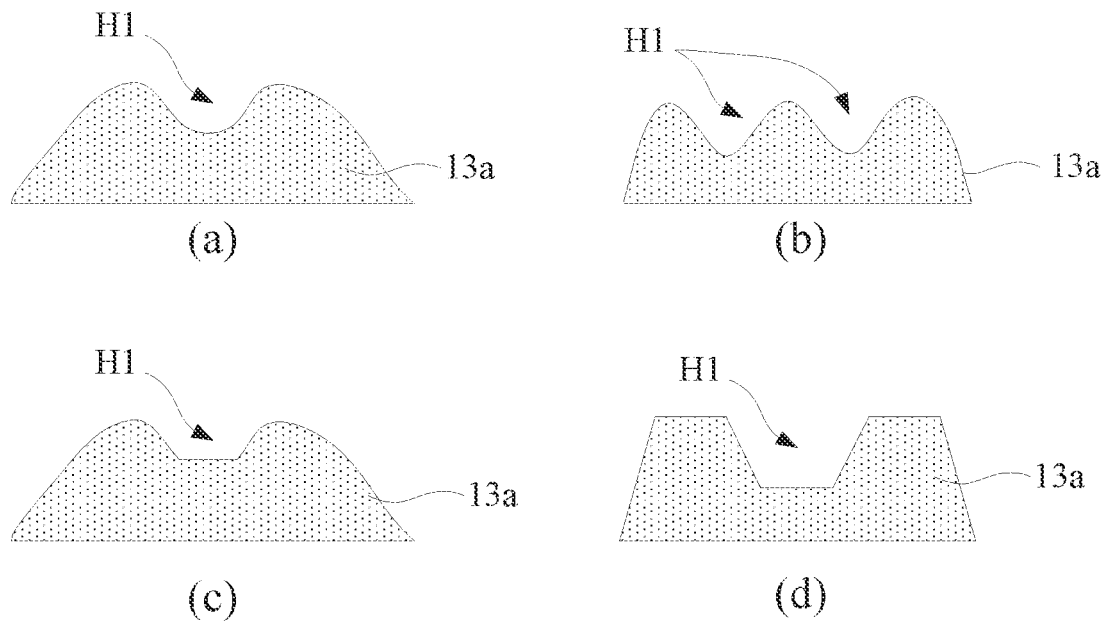
FIG. 9A is a diagram showing some structures of a pixel defining portion, in accordance with some embodiments.

FIG. 9A is a diagram showing some structures of a pixel defining portion 13a, in accordance with some embodiments. As shown in (a) and (b) in FIG. 9A, a bottom of the first hole H1 may be curved; alternatively, as shown in (c) and (d) in FIG. 9A, the bottom of the first hole H1 may be flat.

In some examples, as shown in FIGS, 4A and 4D, the surface S13a of each pixel defining portion 13a facing the opposite substrate 200 is provided with at least one first hole H1.

In some other examples, as shown in FIG. 4C, the surface S13a of each pixel defining portion 13a facing the opposite substrate 200 is provided with one first hole H1, and first holes H1 in all pixel defining portions 13a are connected to form an integral structure.

In yet some other examples, the surface S13a of each of a part of pixel defining portions 13a facing the opposite substrate 200 is provided with at least one first hole H1.

In some embodiments, as shown in FIGS. 4A to 4D, a pixel defining portion 13a provided with at least one first hole H1 extends in a first direction, which is, for example, the row direction X1 or the column direction X2. In a second direction perpendicular to the first direction, the dimension of each first hole H1 (i.e., a width $W_1$ of the first hole H1), is in a range of 2.5% to 30%, inclusive, such as 2,5%, 5%, 10%, 15%, 20%, 25% or 30%, of a dimension of the pixel defining portion 13a (i.e., the width $W_{13a}$ of the pixel defining portion 13a).

Herein, in a case where the first direction is the row direction X1, the second direction is the column direction X2; conversely, in a case where the first direction is the column direction X2. the second direction is the row direction X1.

For example, in a case where the width $W_{13a}$ of the pixel defining portion 13a is determined to be 20 μm based on the foregoing description, the width $W_1$ of each first hole H1 may be adjusted in a range of 0.5 μm to 6.0 μm, inclusive.

In some embodiments, as shown in FIG. 4A, the at least one first hole H1 includes one first hole H1, which is symmetrical with respect to an axis of the surface S13a of the pixel defining portion 13a provided with the first hole H1. Herein, the axis is parallel to the extension direction of the pixel defining portion 13a. For example, in a case where the pixel defining portion 13a extends in the row direction X1, i.e., in a case where the extension direction thereof is the row direction X1, the axis is parallel to the row direction X1. For another example, in a case where the pixel defining portion 13a extends in the column direction X2, i.e., in a case where the extension direction thereof is the column direction X2, the axis is parallel to the column direction X2.

In some other embodiments, as shown in FIG. 40, the at least one first hole H1 includes at least two first holes H1. A distance between a first first hole H1 and a boundary, proximate to the first first hole H1, of the surface S13a of the pixel defining portion 13a provided with the at least two first holes H1, a distance between any two adjacent first holes H1, and a distance between a last first hole H1 and a boundary, proximate to the last first hole H1, of the surface S13a of the pixel defining portion 13a are all equal. In this way, the plurality of first holes H1 may be uniformly distributed in the surface S13a of the pixel defining portion 13a to reflect light uniformly.

Considering an example in which the at least one first hole H1 includes two first holes H1, in a pixel defining portion 13a provided with the two first holes H1, in a direction perpendicular to an extension direction of the pixel defining portion 13a (i.e., in a width direction thereof), a first hole H1 is located at a position corresponding to one-third of a width $W_{13a}$ of the pixel defining portion 13a on a surface S13a of the pixel defining portion 13a, and the other first hole H1 is located at a position corresponding to two-thirds of the width $W_{13a}$ of the pixel defining portion 13a on the surface S13a of the pixel defining portion 13a.

In some embodiments, as shown in (d) in FIG. 9A, the surface of the pixel defining portion 13a provided with the first hole H1 may be a flat surface.

In some other embodiments, the at least one first hole H1 and the pixel defining portion 13a provided with the at least one first hole H1 both extend in the first direction, which is, for example, the row direction X1 or the column direction X2. As shown in FIGS. 3A to 3D, in the surface of the pixel defining portion 13a provided with the at least one first hole H1, portions on two opposite sides of each first hole H1 are both arc surfaces, and centers of the arc surfaces are each located on a side of the surface S13a facing the first base 10. Herein, a direction pointing from one of the two sides to the other side is the second direction perpendicular to the first direction. That is, in the case where the first direction is the row direction X1, the second direction is the column direction X2; conversely, in the case where the first direction is the column direction X2, the second direction is the row direction X1.

In this way, by virtue of the arc surfaces and the first hole H1 between the arc surfaces, it may be possible to increase a degree to which light reaching a region of the electrode layer 15 located above the pixel defining portion 13a is reflected back and forth, so as to reduce crosstalk to adjacent sub-pixel regions.

For example, in the case where the width $W_{13a}$ of the pixel defining portion 13a is determined to be 20 μm based on the foregoing description, radii of the arc surfaces may be adjusted in a range of 6.0 μm to 10.0 μm, inclusive.

Since a part of the light emitted by the light-emitting layer 14 that is inclined at large angles may reach the reflective barrier body 210, as shown in FIGS. 3B and 3D, in the barrier layer 21, a surface S21a, facing the light-emitting substrate 100, of each of at least one bank 21a is provided with at least one second hole H2.

Herein, the second hole H2 refers to a portion, recessed toward the second base 20, in the surface S21a, facing the light-emitting substrate 100, of the bank 21a provided with the second hole H2.

In some examples, a layer of reflective barrier material with a thickness in a range of 10 µm to 13 µm inclusive may be formed on the second base 20, the light-shielding layer 23 or the plurality of auxiliary light processing films 12, and a reflective barrier material in a partial region may be removed through a corresponding manufacturing process to form the second opening portions OP2 and the second holes H2 and then form the barrier layer 21.

For example, a light-shielding material in the reflective barrier material is photoresist, by adjusting process conditions such as pre-baking, exposure, development, post-baking and ashing, the second opening portions OP2 and the second holes H2 may be formed, and a shape of a surface S210 of the barrier body 210 facing the light-emitting substrate 100 may also be adjusted.

For another example, the light-shielding material in the reflective barrier material is resin, through a nanoimprinting process, the second opening portions OP2 and the second holes H2 may be formed and the shape of the surface S210 of the barrier body 210 facing the light-emitting substrate 100 may also be adjusted.

In the pointing direction D, a dimension (i.e., a depth) of the second holes H2 may be 60% to 100% of the thickness of the coated layer of reflective barrier material.

That is to say, in some examples, as shown in FIGS. 5A, 5B and 5D, a second hole H2 does not penetrate a corresponding bank 21a. In this case, the second hole H2 is a groove (also referred to as a blind hole). In some other examples, as shown in FIG. 5C, a second hole H2 penetrates a corresponding bank 21a. In this case, the second hole H2 is a through hole (i.e., an opening smaller than the second opening portion OP2).

Figure 9B:
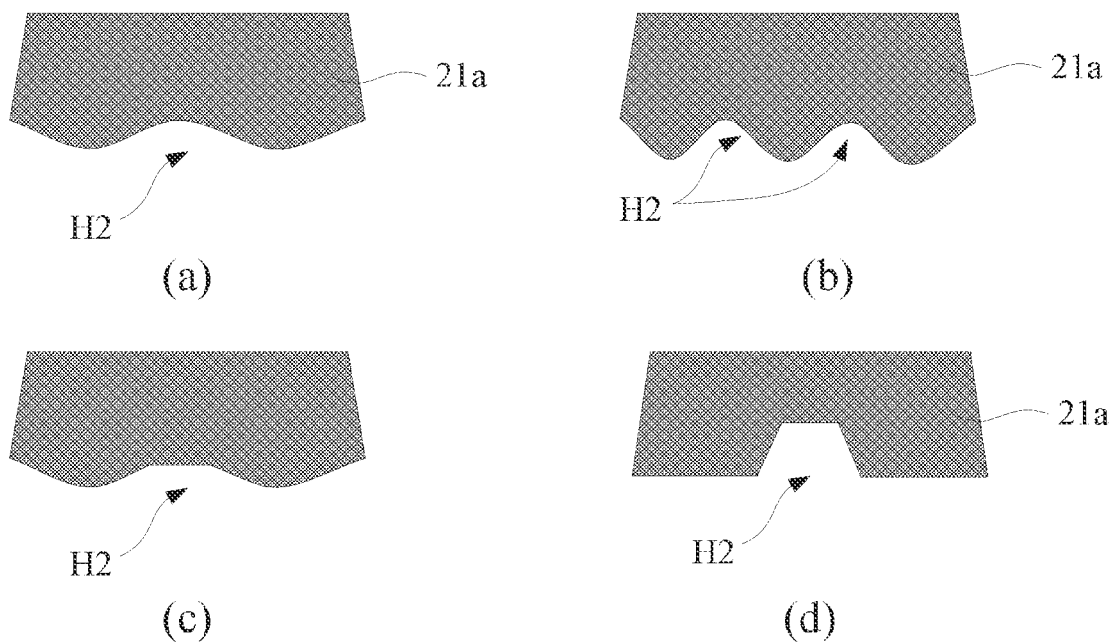
FIG. 9B is a diagram showing some structures of a bank, in accordance with some embodiments.

FIG. 9B is a diagram showing some structures of a bank 21a, in accordance with some embodiments. As shown in (a) and (b) in FIG. 9B, a bottom of the second hole H2 may be curved; alternatively, as shown in (c) and (d) in FIG. 9B, the bottom of the second hole H2 may be flat.

In some examples, as shown in FIGS. 5A and 5D, the surface S21a of each bank 21a facing the light-emitting substrate 100 is provided with at least one second hole H2.

In some other examples, as shown in FIG. 5C, the surface S21a of each bank 21a facing the light-emitting substrate 100 is provided with one second hole H2, and second holes H2 in all banks 21a are connected to form an integral structure.

In yet some other examples, the surface S21a of each of a part of banks 21a facing the light-emitting substrate 100 is provided with at least one second hole H2.

In some embodiments, as shown in FIGS. 5A to 5D, a bank 21a provided with at least one second hole H2 extends in the first direction, which is, for example, the row direction X1 or the column direction X2. In the second direction perpendicular to the first direction, the dimension of each second hole H2 (i.e., a width $W_2$ of the second hole H2), is in a range of 2.5% to 30%, inclusive, such as 2.5%, 5%, 10%, 15%, 20%, 25% or 30%, of a dimension of the bank 21a (i.e., a width $W_{21a}$ of the bank 21a).

Herein, in the case where the first direction is the row direction X1, the second direction is the column direction X2; conversely, in the case where the first direction is the column direction X2, the second direction is the row direction X1.

For example, in the case where the width $W_{13a}$ of the pixel defining portion 13a is determined to be 20 µm based on the foregoing description, considering an alignment deviation between the light-emitting substrate 100 and the opposite substrate 200 when they are aligned, the width W21a of the bank 21a is slightly larger than the width $W_{13a}$ of the pixel defining portion 13a by 11 µm, that is, the width $W_{21a}$ of the bank 21a is 31 µm, and the width $W_2$ of each second hole H2 may be adjusted in a range of 0.775 µm to 9.3 µm, inclusive.

In some embodiments, as shown in FIG. 5A, the at least one second hole H2 includes one second hole H2, which is symmetrical with respect to an axis of the surface S21a of the bank 21a provided with the second hole H2. Herein, the axis is parallel to an extension direction of the bank 21a. For example, in a case where the bank 21a extends in the row direction X1, i.e., in a case where the extension direction thereof is the row direction X1, the axis is parallel to the row direction X1. For another example, in a case where the bank 21a extends in the column direction X2, i.e., in a case where the extension direction thereof is the column direction X2, the axis is parallel to the column direction X2.

In some other embodiments, as shown in FIG. 5D, the at least one second hole H2 includes at least two second holes H2. A distance between a first second hole H2 and a boundary, proximate to the first second hole H2, of the surface S21a of the bank 21a provided with the at least two second holes H2, a distance between any two adjacent second holes H2, and a distance between a last second hole H2 and a boundary, proximate to the last second hole H2, of the surface S21a of the bank 21a are all equal. In this way, the plurality of second holes H2 may be uniformly distributed in the surface S21a of the bank 21a to reflect light uniformly.

Considering an example in which the at least one second hole H2 includes two second holes H2, in a bank 21a provided with the two second holes H2, in a direction perpendicular to an extension direction of the bank 21a (i.e., in a width direction thereof), a second hole H2 is located at a position corresponding to one-third of a width $W_{21a}$ of the bank 21a on a surface S21a of the bank 21a, and the other second hole H2 is located at a position corresponding to two-thirds of the $W_{21a}$ of the bank 21a on the surface S21a of the bank 21a.

In some embodiments, as shown in (d) in FIG. 9B, the surface of the bank 21a provided with the second hole H2 may be a flat surface.

In some other embodiments, the at least one second hole H2 and the bank 21a provided with the at least one second hole H2 both extend in the first direction, which is, for example, the row direction X1 or the column direction X2. As shown in FIGS. 3B and 3D, in the surface S21a of the bank 21a provided with the at least one second hole H2, portions on two opposite sides of each second hole H2 are both arc surfaces, and centers of the arc surfaces are each located on a side of the surface S21a facing the second base 20. Herein, a direction pointing from one of the two sides to the other side is the second direction perpendicular to the first direction. That is, in the case where the first direction is the row direction X1, the second direction is the column direction X2; conversely, in the case where the first direction is the column direction X2, the second direction is the row direction X1.

In this way, by virtue of the arc surfaces and the second hole H2 between the arc surfaces, it may be possible to increase a degree to which light reaching the surface S210 of the barrier body 210 facing the light-emitting substrate 100 is reflected back and forth, so as to reduce crosstalk to adjacent sub-pixel regions.

For example, in a case where the width $W_{21a}$ of the bank 21a is determined to be 31 µm based on the foregoing description, radii of the arc surfaces may be adjusted in a range of 9.3 µm to 15.5 µm, inclusive.

In this way, by virtue of the first holes H1 in the pixel defining layer 13, it may be possible to prevent the light scattered by the quantum dots or scattering particles from entering adjacent sub-pixel regions or to reduce an amount of the light scattered by the quantum dots or scattering particles that enters the adjacent sub-pixel regions, or to prevent light reflected by the barrier body 210 at a large angle from entering adjacent sub-pixel regions or to reduce an amount of the light reflected by the barrier body 210 at the large angle that enters the adjacent sub-pixel regions. In addition, by virtue of the second holes H2 in the barrier layer 21, light reaching partial regions of the second holes H2 may be reflected toward regions from which the light comes, so as to reduce crosstalk to adjacent sub-pixel regions.

In some embodiments, in the pointing direction D, the plurality of pixel defining portions 13a are in one-to-one correspondence with the plurality of banks 21a, and an orthogonal projection of each pixel defining portion 13a on the first base 10 is within an orthogonal projection of a corresponding bank 21a on the first base 10. For a pixel defining portion 13a provided with at least one first hole H1, a bank 21a corresponding to the pixel defining portion 13a is provided with at least one second hole H2.

Figure 9C:
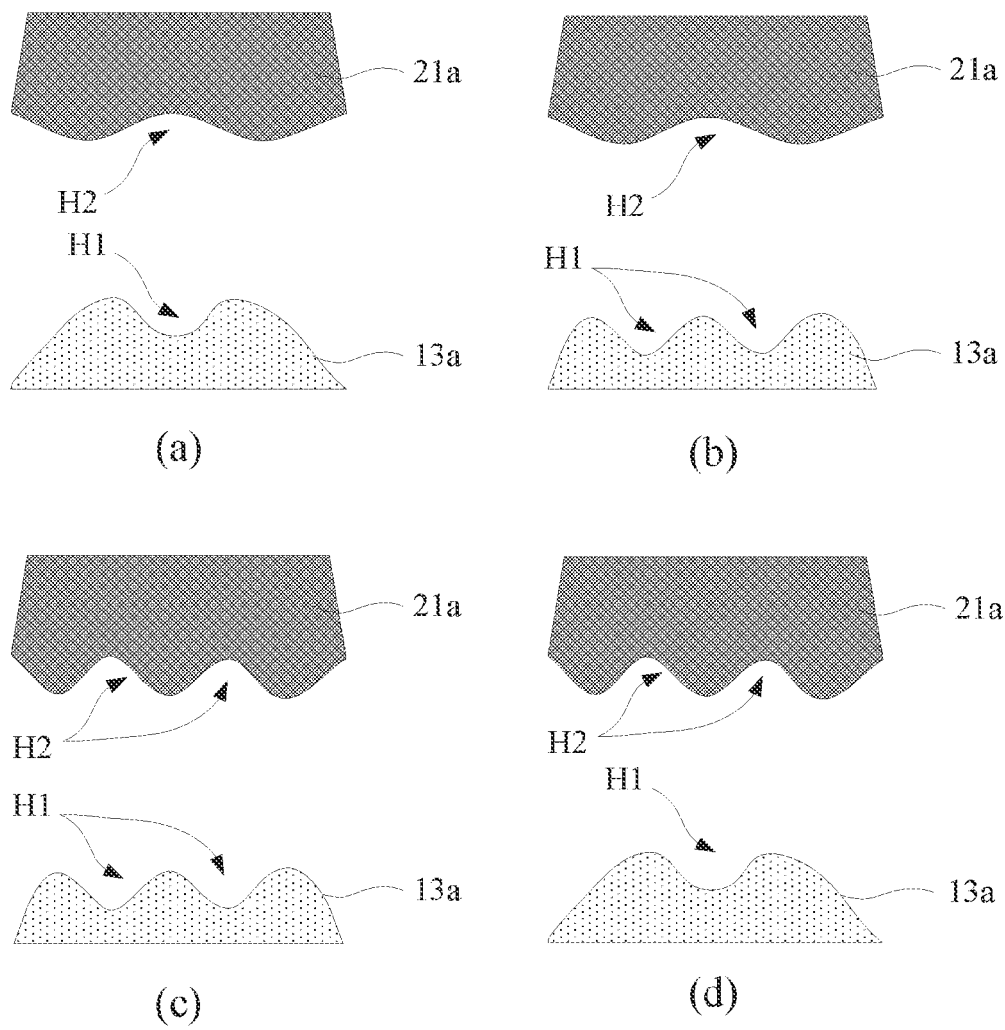
FIG. 9C is a diagram showing correspondence between first hole(s) in a pixel defining portion and second hole(s) in a bank, in accordance with some embodiments.

FIG. 9C is a diagram showing correspondence between first hole(s) H1 in a pixel defining portion 13a and second hole(s) H2 in a bank 21a, in accordance with some embodiments. As shown in FIG. 9C, the at least one first hole H1 and the at least one second hole H2 may be arranged in any one of the following manners:

As shown in (a) in FIG. 9C, the at least one first hole H1 includes one first hole H1, and the at least one second hole H2 includes one second hole H2 corresponding to the first hole H1.

Herein, the first hole H1 corresponding to the second hole H2 means that the first hole H1 and the second hole H2 extend in a same direction, and their orthogonal projections on the first base 10 overlap.

For example, correspondence between the first hole H1 and the second hole H2 may be vertical correspondence. That is, an axis of the orthogonal projection of the first hole H1 on the first base 10 and an axis of the orthogonal projection of the second hole H2 on the first base 10 coincide.

As shown in (b) in FIG. 9C, the at least one first hole H1 includes two first holes H1 arranged at an interval, the at least one second hole H2 includes one second hole H2, and the second hole H2 corresponds to a region between the two first holes H1.

Herein, the second hole H2 corresponding to the region between the two first holes H1 means that the second hole H2 and the two first holes H1 extend in a same direction, and an orthogonal projection of the second hole H2 on the first base 10 overlaps with an orthogonal projection of the region on the first base 10.

For example, correspondence between the second hole H2 and the region may be vertical correspondence. That is, an axis of the orthogonal projection of the second hole H2 on the first base 10 and an axis of the orthogonal projection of the region on the first base 10 coincide.

As shown in (c) in FIG. 9C, the at least one first hole H1 includes at least two first holes H1 arranged at interval(s), the at least one second hole H2 includes at least two second holes H2 arranged at interval(s), and each second hole H2 corresponds to a first hole H1.

Herein, the first hole H1 corresponding to the second hole H2 means that the first hole H1 and the second hole H2 extend in a same direction, and their orthogonal projections on the first base 10 overlap.

For example, correspondence between each first hole H1 and a second hole H2 may be vertical correspondence. That is, an axis of the orthogonal projection of the first hole H1 on the first base 10 and an axis of the orthogonal projection of the second hole H2 on the first base 10 coincide.

As shown in (d) in FIG. 9C, the at least one first hole H1 includes one first hole H1, the at least one second hole H2 includes two second holes H2 arranged at an interval, and a region between the two second holes H2 corresponds to the first hole H1.

Herein, the first hole H1 corresponding to the region between the two second holes H2 means that the first hole H1 and the two second holes H2 extend in a same direction, and an orthogonal projection of the first hole H1 on the first base 10 overlaps with an orthogonal projection of the region on the first base 10.

For example, correspondence between the first hole H1 and the region may be vertical correspondence. That is, an axis of the orthogonal projection of the first hole H1 on the first base 10 and an axis of the orthogonal projection of the region on the first base 10 coincide.

In this way, by virtue of cooperation between the first hole(s) H1 in the pixel defining portion 13a and the second hole(s) H2 in the bank 21a, a degree to which light reaching a region between the pixel defining portion 13a and the bank 21a is reflected back and forth may be further increased, a total amount of light emitted from the region may be reduced, and the crosstalk may be further reduced.

Figure 10:
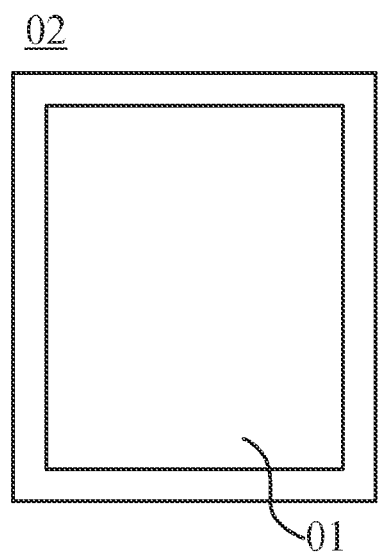
FIG. 10 is a diagram showing a structure of a display apparatus, in accordance with some embodiments.

Some embodiments of the present disclosure provide a display apparatus. FIG. 10 is a diagram showing a structure of the display apparatus 02, in accordance with some embodiments. As shown in FIG. 10, the display apparatus 02 includes the display panel 01. Beneficial effects that may be achieved by the display apparatus 02 are the same as beneficial effects that may be achieved by the display panel 01, and details will not be repeated herein.

The display apparatus may be a self-luminescent display apparatus, such as an OLED display, an OLED TV, a mobile phone, a tablet computer, a navigator, a digital photo frame, a wearable display product, a vehicle-mounted display product, a ship-mounted display product, or any other product or component with a display function.

It can be understood that, the display panel 01 may also have a peripheral area surrounding the display area AA. The display panel 01 may further include a plurality of signal wires, a gate driver circuit and a data driver circuit that are located in the peripheral area.

In addition to the display panel 01, the display apparatus 02 may further include other components and structures. Considering an example in which the display apparatus 02 is a display, the display apparatus 02 may further include a housing, a circuit board, a power supply line and other components. The circuit board is used to provide signals required for display of the display panel 01. For example, the circuit board is a printed circuit board assembly (PCBA), which includes a printed circuit board (PCB), a timing controller (TCON) disposed on the PCB, a power management integrated circuit (PMIC), and other ICs or circuits. A person skilled in the art may make corresponding supplementation based on specific usage requirements of the display apparatus, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a light-emitting substrate;
   an opposite substrate; and
   an intermediate layer assembly between the light-emitting substrate and the opposite substrate, wherein the light-emitting substrate has a light-emitting surface configured to allow light to be emitted from, and the intermediate layer assembly is configured to direct the light emitted from the light-emitting surface to the opposite substrate;
   the intermediate layer assembly includes a thin film encapsulation layer, a filler layer, and an overcoat that are sequentially stacked in a pointing direction pointing from the light-emitting substrate to the opposite substrate;
   the thin film encapsulation layer includes at least two encapsulation sub-layers that are stacked in the pointing direction;
   in the pointing direction, refractive indexes of the encapsulation sub-layers gradually increase, and thicknesses of the encapsulation sub-layers gradually increase;
   a refractive index of the overcoat is higher than a refractive index of the filler layer.

2. The display panel according to claim 1, wherein an absolute value of a difference between the refractive index of the filler layer and a refractive index of an encapsulation sub-layer, closest to the filler layer, in the thin film encapsulation layer is in a range of 0 to 0.4, inclusive.

3. The display panel according to claim 1, wherein a refractive index of each encapsulation sub-layer is in a range of 1.7 to 1.9, inclusive.

4. The display panel according to claim 3, wherein a thickness of each encapsulation sub-layer is in a range of 0.6 μm to 1.2 μm, inclusive.

5. The display panel according to claim 3, wherein the refractive index of the filler layer is in a range of 1.5 to 1.7, inclusive, and the refractive index of the overcoat is in a range of 1.7 to 1.85, inclusive.

6. The display panel according to claim 5, wherein a thickness of the filler layer is in a range of 4.0 μm to 8.0 μm, inclusive, and a thickness of the overcoat is in a range of 1.0 μm to 3.0 μm, inclusive.

7. The display panel according to claim 1, wherein the refractive index of the filler layer is higher than a refractive index of an encapsulation sub-layer, closest to the filler layer, in the thin film encapsulation layer.

8. The display panel according to claim 1, wherein the light-emitting substrate includes:
   a first base;
   a pixel defining layer on a side of the first base facing the opposite substrate, wherein the pixel defining layer includes a plurality of first opening portions arranged at intervals, and a pixel defining body surrounding the plurality of first opening portions; the pixel defining body includes a plurality of pixel defining portions, a pixel defining portion is provided between any two adjacent first opening portions, and a surface, facing the opposite substrate, of each of at least one pixel defining portion is provided with at least one first hole;
   a plurality of reflective electrodes arranged at intervals, the plurality of reflective electrodes being in one-to-one correspondence with the plurality of first opening portions, and at least a part of each reflective electrode being exposed by a corresponding first opening portion;
   a light-emitting layer configured to emit light of a third color, the light-emitting layer covering the at least the part of each reflective electrode exposed by the corresponding first opening portion and the pixel defining body, and the light of the third color being light emitted by the light-emitting substrate; and
   an electrode layer covering a surface of the light-emitting layer facing away from the pixel defining layer, a surface of the electrode layer facing away from the light-emitting layer being the light-emitting surface;
   the opposite substrate includes:
   a plurality of light processing films in one-to-one correspondence with the plurality of first opening portions, the plurality of light processing films including a plurality of first quantum dot films configured to emit light of a first color upon excitation of the light of the third color, a plurality of second quantum dot films configured to emit light of a second color upon the excitation of the light of the third color, and a plurality of light-transmitting films configured to transmit the light of the third color;
   the first color, the second color, and the third color constitute three primary colors.

9. The display panel according to claim 8, wherein the at least one first hole and a pixel defining portion provided with the at least one first hole both extend in a first direction, and the first direction is a row direction or a column direction;
   in a surface of the pixel defining portion provided with the at least one first hole, portions on two opposite sides of each first hole are arc surfaces, and centers of the arc surfaces are each located on a side of the surface facing the first base;
   a direction pointing from one of the two opposite sides to another side is a second direction perpendicular to the first direction.

10. The display panel according to claim 8, wherein a pixel defining portion provided with the at least one first hole extends in a first direction, and the first direction is a row direction or a column direction;
   in a second direction perpendicular to the first direction, a dimension of each first hole, is in a range of 2.5% to 30%, inclusive, of a dimension of the pixel defining portion.

11. The display panel according to claim 8, wherein the at least one first hole includes one first hole, the one first hole is symmetrical with respect to an axis of a surface of a pixel defining portion provided with the one first hole, and the axis is parallel to an extension direction of the pixel defining portion; or
   the at least one first hole includes at least two first holes, a distance between a first hole and a boundary, proximate to the first first hole, of a surface of a pixel defining portion provided with the at least two first holes, a distance between any two adjacent first holes, and a distance between a last first hole and a boundary, proximate to the last first hole, of the surface of the pixel defining portion are all equal.

12. The display panel according to claim 8, wherein each first hole is a groove.

13. The display panel according to claim 8, wherein the opposite substrate further includes:

a second base; and a barrier layer on a side of the second base facing the light-emitting substrate, wherein the barrier layer includes a plurality of second opening portions in one-to-one correspondence with the plurality of first opening portions, and a barrier body surrounding the plurality of second opening portions;

the barrier body includes a plurality of banks, a bank is provided between any two adjacent second opening portions, and a surface, facing the light-emitting substrate, of each of at least one bank is provided with at least one second hole, wherein the plurality of light processing films are located in the plurality of second opening portions in one-to-one correspondence.

14. The display panel according to claim 13, wherein the at least one second hole and a bank provided with the at least one second hole both extend in a first direction, and the first direction is a row direction or a column direction;

in a surface of the bank provided with the at least one second hole, portions on two opposite sides of each second hole are arc surfaces, and centers of the arc surfaces are each located on a side of the surface facing the second base;

a direction pointing from one of the two opposite sides to another side is a second direction perpendicular to the first direction.

15. The display panel according to claim 13, wherein a bank provided with the at least one second hole extends in a first direction, and the first direction is a row direction or a column direction;

in a second direction perpendicular to the first direction, a dimension of each second hole, is in a range of 2.5% to 30%, inclusive, of a dimension of the bank.

16. The display panel according to claim 13, wherein the at least one second hole includes one second hole, the one second hole is symmetrical with respect to an axis of a surface of a bank provided with the one second hole, and the axis is parallel to an extension direction of the bank; or the at least one second hole includes at least two second holes, a distance between a first second hole and a boundary, proximate to the first second hole, of a surface of a bank provided with the at least two second holes, a distance between any two adjacent second holes, and a distance between a last second hole and a boundary, proximate to the last second hole, of the surface of the bank are all equal.

17. The display panel according to claim 13, wherein each second hole is a groove.

18. The display panel according to claim 13, wherein in the pointing direction, the plurality of pixel defining portions are in one-to-one correspondence with the plurality of banks, and an orthogonal projection of each pixel defining portion on the first base is within an orthogonal projection of a corresponding bank on the first base;

for a pixel defining portion provided with the at least one first hole, a bank corresponding to the pixel defining portion is provided with at least one second hole, and the at least one first hole and the at least one second hole are arranged in any one of following manners:

the at least one first hole includes one first hole, and the at least one second hole includes one second hole corresponding to the one first hole;

the at least one first hole includes two first holes arranged at an interval, the at least one second hole includes one second hole, and the one second hole corresponds to a region between the two first holes;

the at least one first hole includes at least two first holes arranged at intervals, the at least one second hole includes at least two second holes arranged at intervals, and each second hole corresponds to a first hole; or the at least one first hole includes one first hole, the at least one second hole includes two second holes arranged at an interval, and a region between the two second holes corresponds to the one first hole.

19. A display apparatus, comprising the display panel according to claim 1.

* * * * *